United States Patent [19]

Roederer

[11] Patent Number: 5,115,248
[45] Date of Patent: May 19, 1992

[54] MULTIBEAM ANTENNA FEED DEVICE

[75] Inventor: Antoine Roederer, Noordwijk, Netherlands

[73] Assignee: Agence Spatiale Europeenne, France

[21] Appl. No.: 585,996

[22] Filed: Sep. 21, 1990

[30] Foreign Application Priority Data

Sep. 26, 1989 [FR] France ............................ 89 12584

[51] Int. Cl.⁵ ............................................ H01Q 3/22
[52] U.S. Cl. .................................. 342/373; 342/368
[58] Field of Search ............................ 342/371–373, 342/375; 343/754

[56] References Cited

U.S. PATENT DOCUMENTS 3,731,316  5/1973  Sheleg ............................ 342/373
3,740,756  3/1972  Sosin .
4,901,085  2/1990  Spring et al. ....................... 342/373

FOREIGN PATENT DOCUMENTS 0333166  3/1989  European Pat. Off. .
2241886  5/1973  France .
2209629  9/1988  United Kingdom .

OTHER PUBLICATIONS

Sharad V. Parekh et al., "Active Antennas for Satellite Communications", IEEE Int'l Conf. on Communications 1985, vol. 3, Jun., 1985, pp. 1299-1305.
Leo G. Cardone, "Wideband Electro-Optical Microwave Beamforming Technique", Conf. Proceed. Military Microwaves, '86, pp. 391A-391F.
S. Egami and M. Kawai, "An Adaptive Multiple Beam System Concept", IEEE Journal on Selected Areas in Communications, May 1987, pp. 630-636.
J. P. Shelton and K. S. Kelleher, "Multiple Beams for Linear Arrays", IRE Transactions on Antennas and Propagation, Mar. 1961, pp. 154-161.

*Primary Examiner*—Gregory C. Issing
*Attorney, Agent, or Firm*—Andrus, Sceales, Starke & Sawall

[57] ABSTRACT

A multibeam antenna comprising Ne feed elements and emitting Nb beams each generated by a group of Nc elements has a feed device comprising a set of Nc power dividers. These power dividers are unitary orthogonal distribution matrix power dividers of order P, where P is equal to the power of two equal to or immediately higher than the ratio Ne/Nc. The outputs of the dividers are connected to the various elements in such a way that each element of one of the aforementioned groups contributing to a beam is connected to a different power divider and so that adjacent beams share feed elements. A beam forming network has P × Nc outputs connected to amplifiers in turn connected to the inputs of the power dividers. This network has Nb inputs. The beam forming network is usually a low-level network. The device finds a specific application in satellite communications.

18 Claims, 23 Drawing Sheets

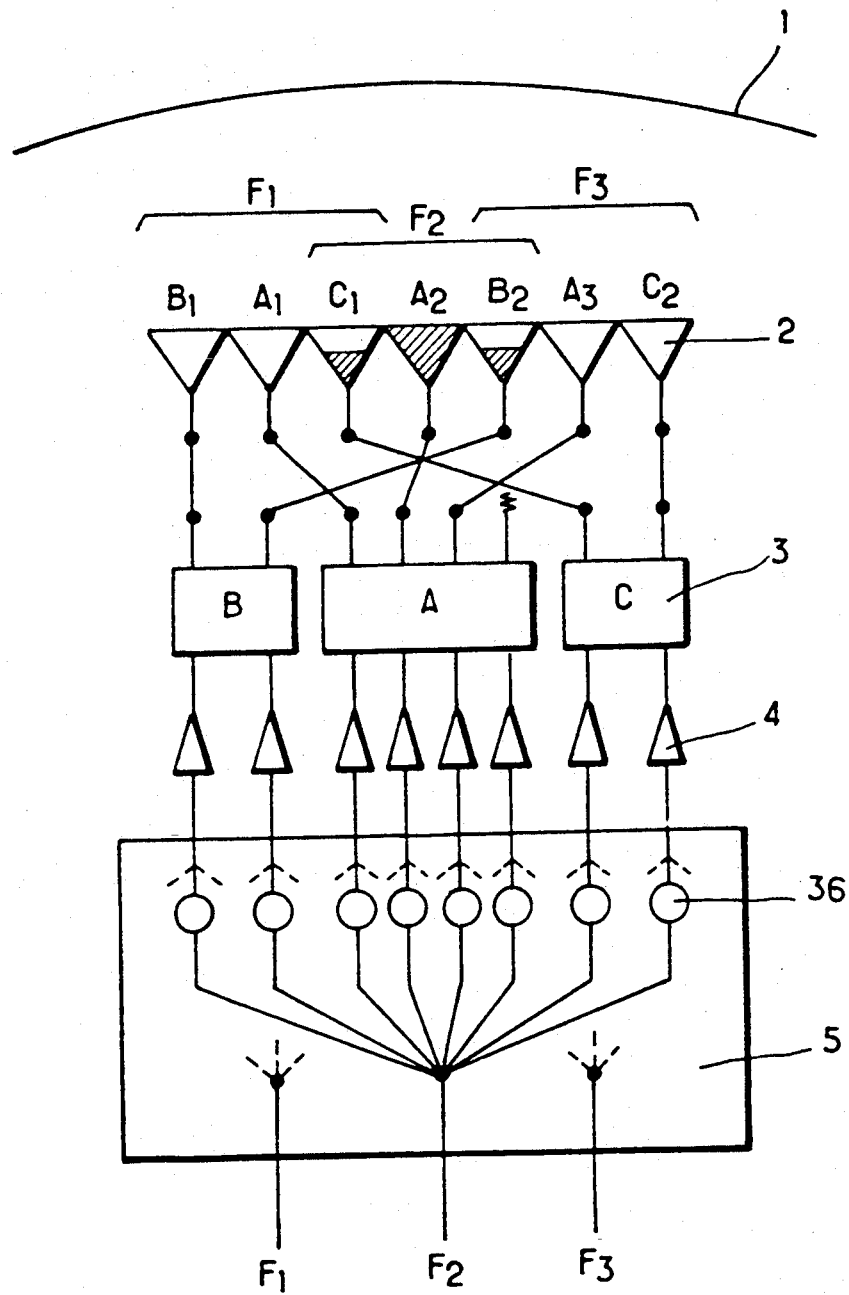

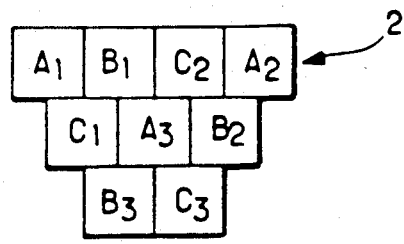
FIG.6A
FIG.6B
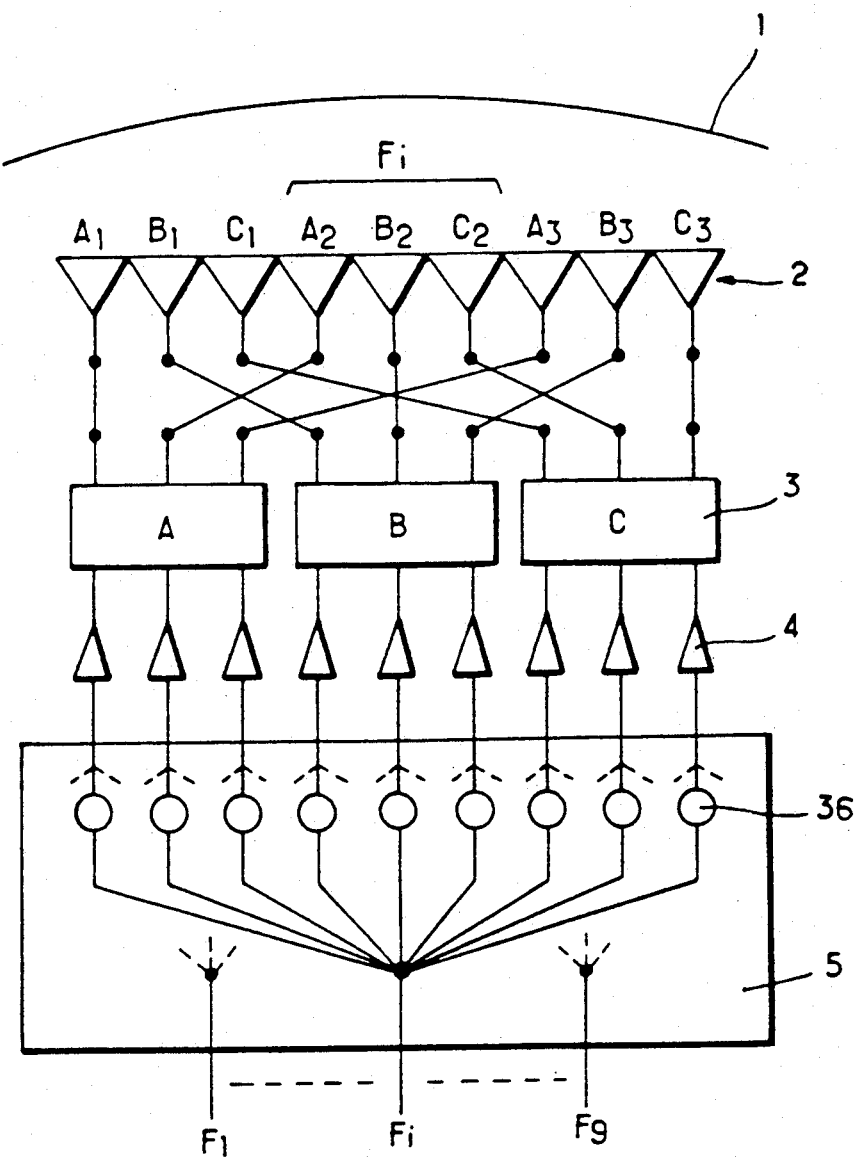

FIG. 7A
| $A_1$ | $B_1$ | $A_2$ | $B_2$ |
|---|---|---|---|
| $B_3$ | $A_3$ | $B_4$ | $A_4$ |
FIG. 7B
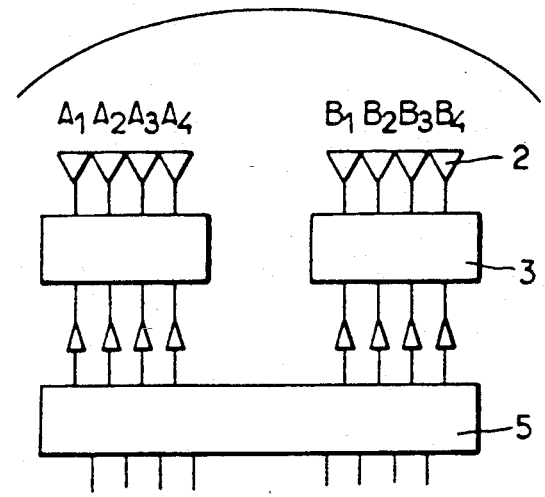
FIG. 8A
| $A_1$ | $B_1$ | $A_2$ | $B_2$ |
|---|---|---|---|
| $B_3$ | $A_3$ | $B_4$ | $A_4$ |
| $A_5$ | $B_5$ | $A_6$ | $B_6$ |
| $B_7$ | $A_7$ | $B_8$ | $A_8$ |
FIG. 8B
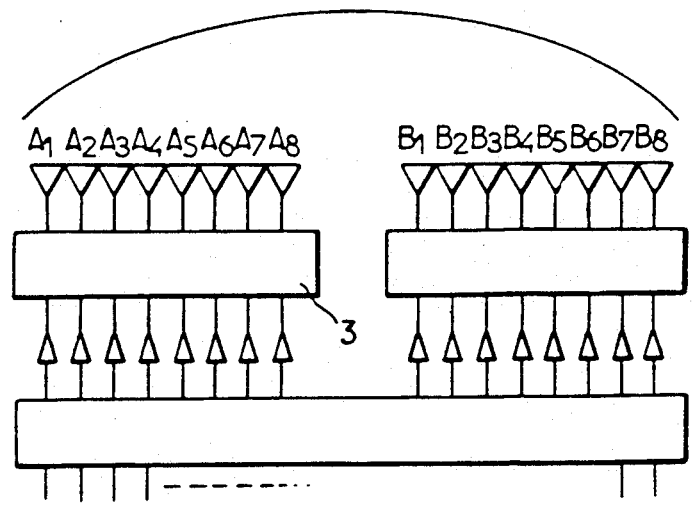

FIG.11A
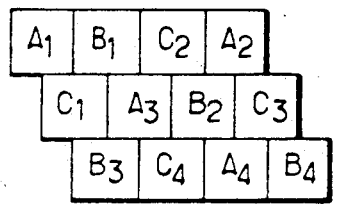
FIG.11B
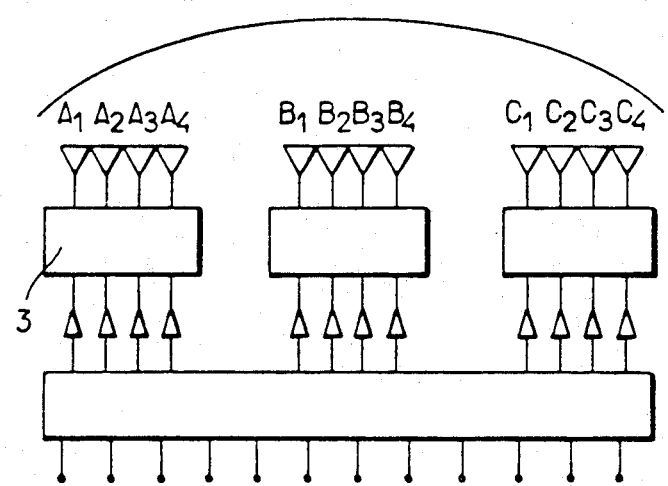
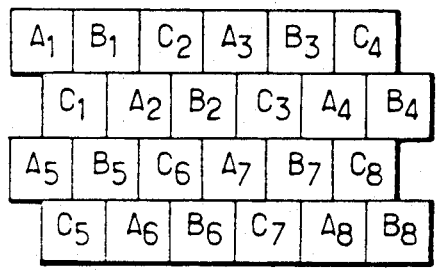
FIG.12A
FIG.12B
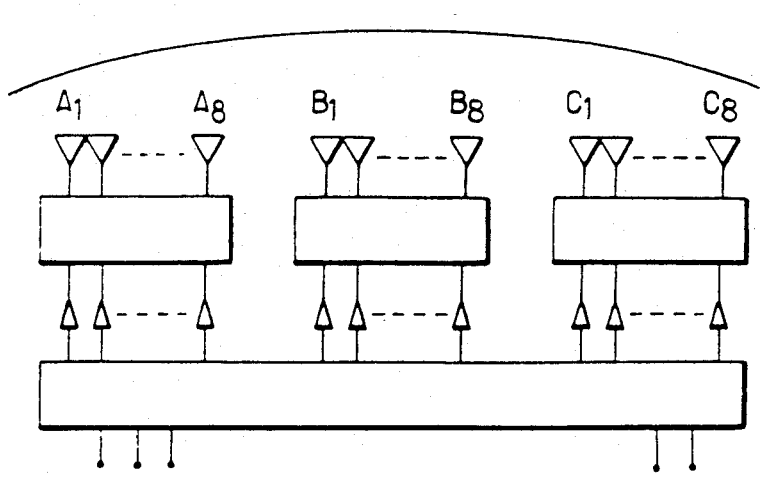

FIG.13A
| A₁ | B₁ | A₂ | B₂ |
|----|----|----|----|
| C₁ | D₁ | C₂ | D₂ |
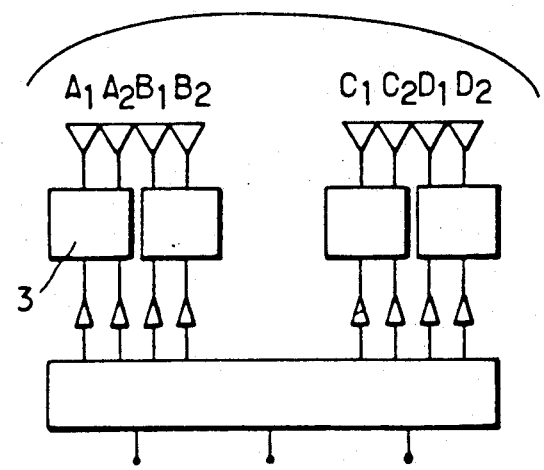
FIG.13B
FIG.14A
| A₁ | B₁ | C₂ | D₂ |
|----|----|----|----|
| C₁ | D₁ | A₂ | B₂ |
| A₃ | B₃ | C₃ | D₃ |
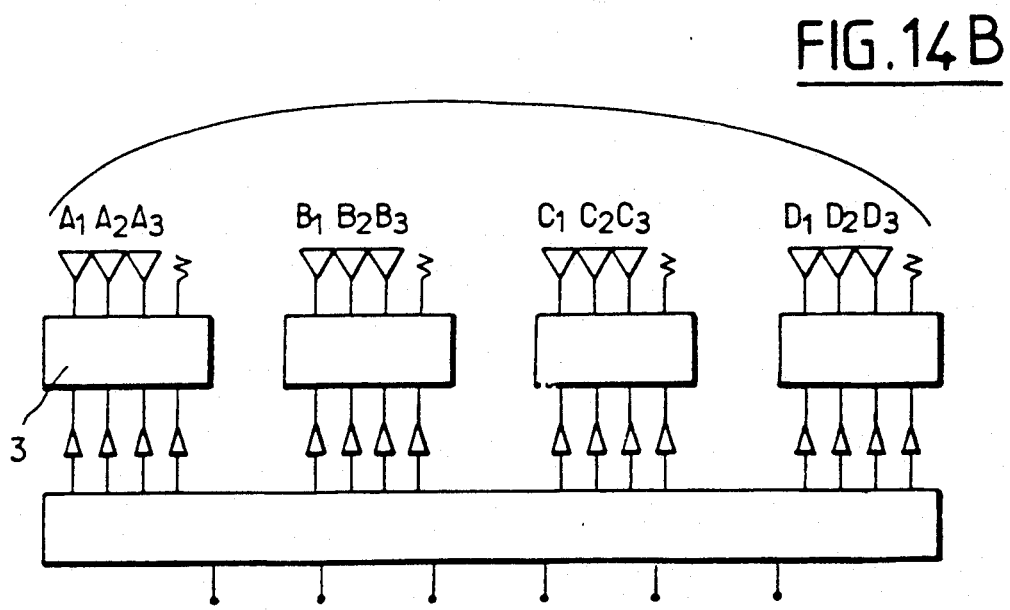
FIG.14B

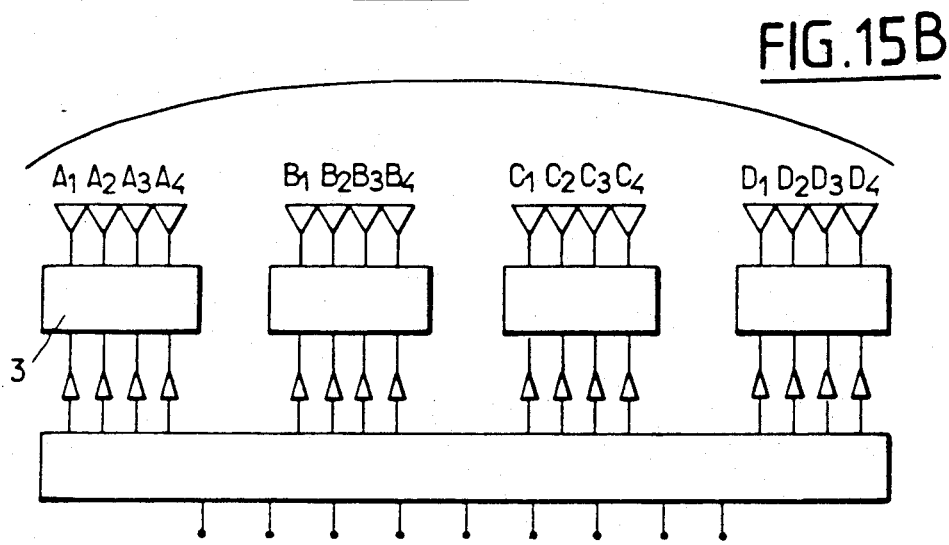
FIG. 15A
FIG. 15B
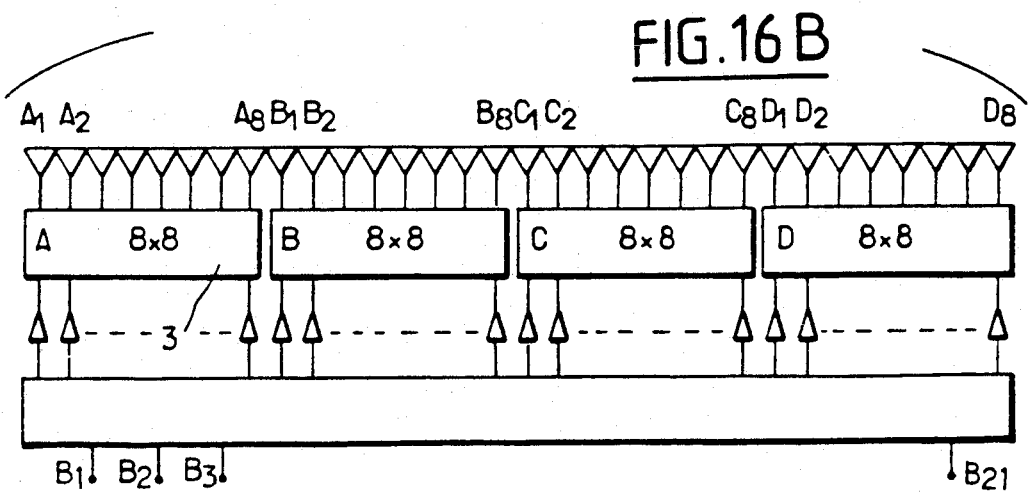
FIG. 16A
FIG. 16B

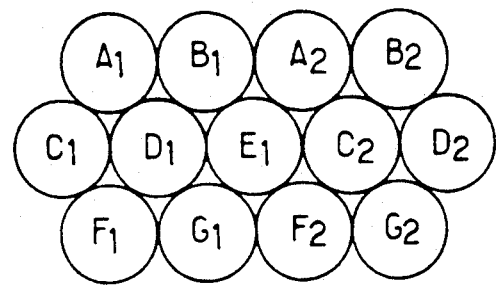
FIG. 17 A
FIG. 17 B
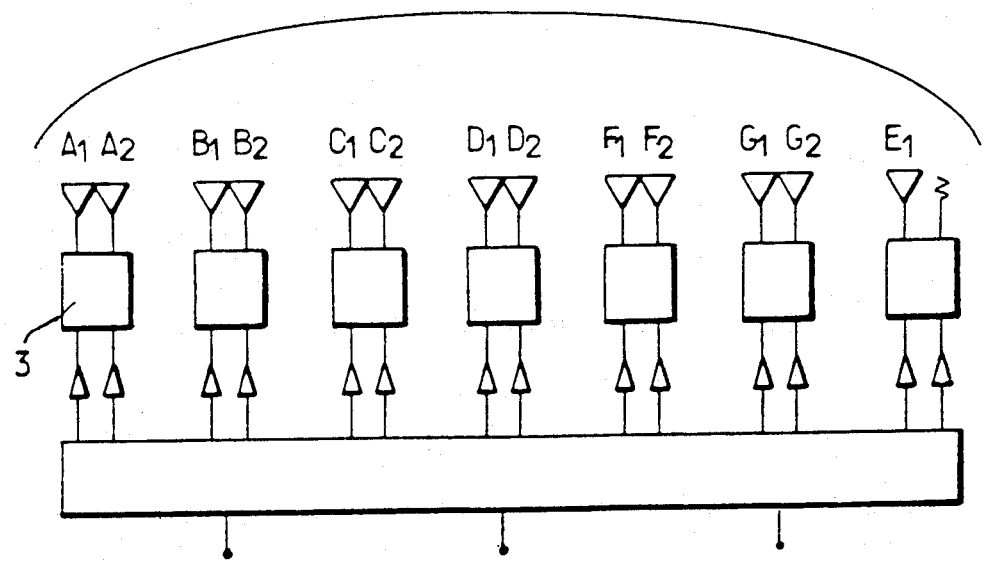

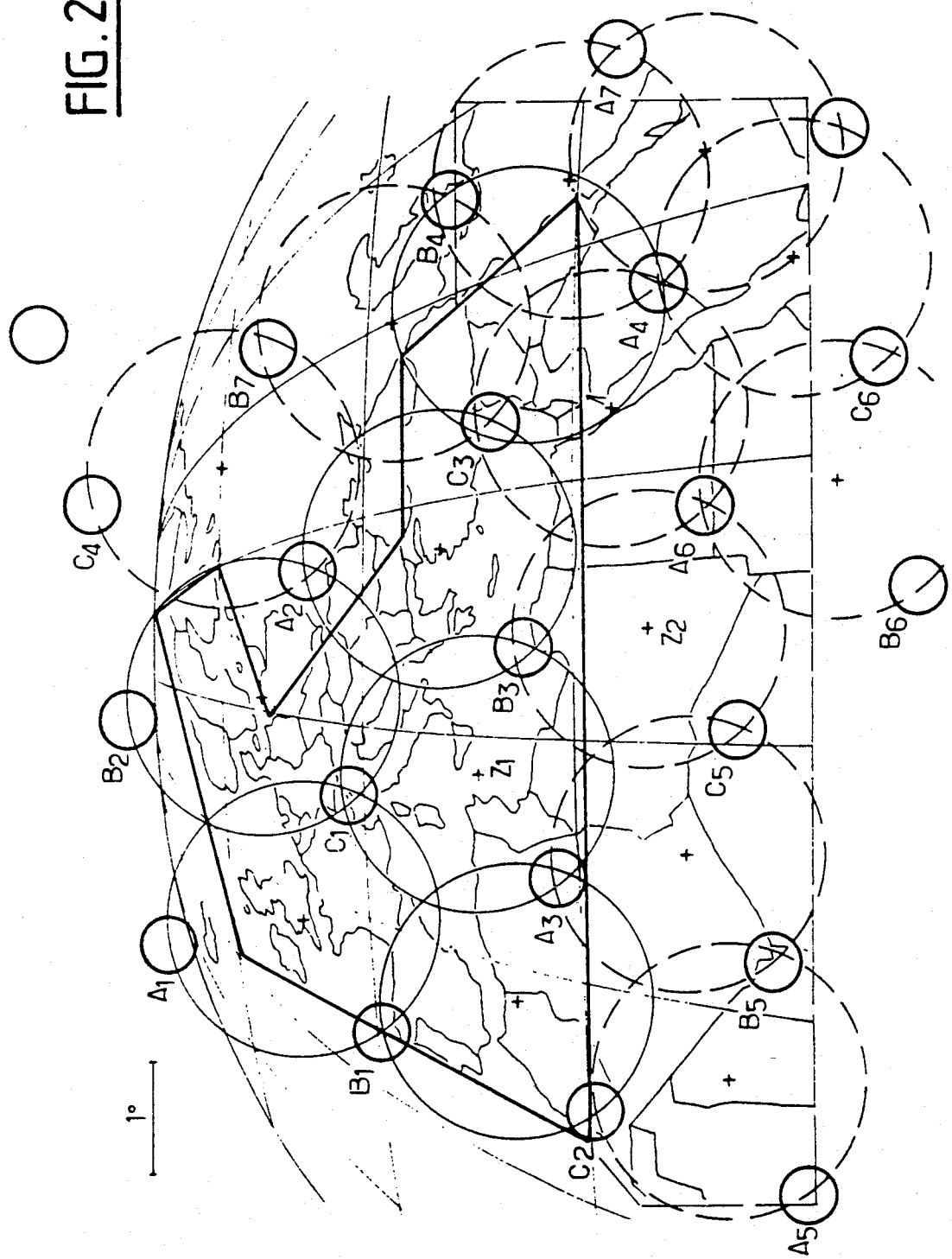

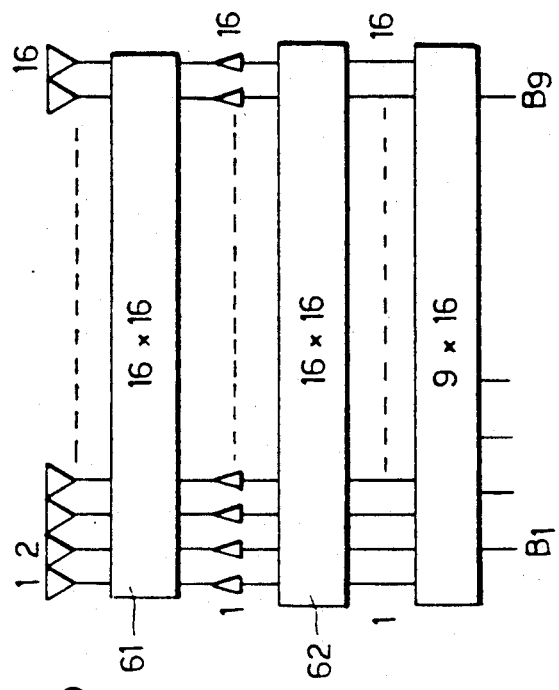
FIG.24B
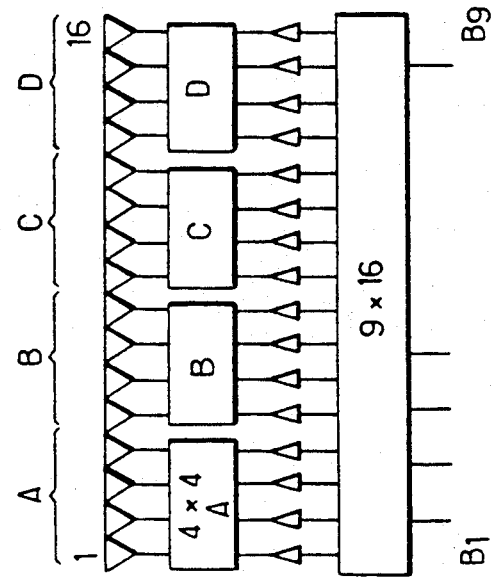
FIG.24C
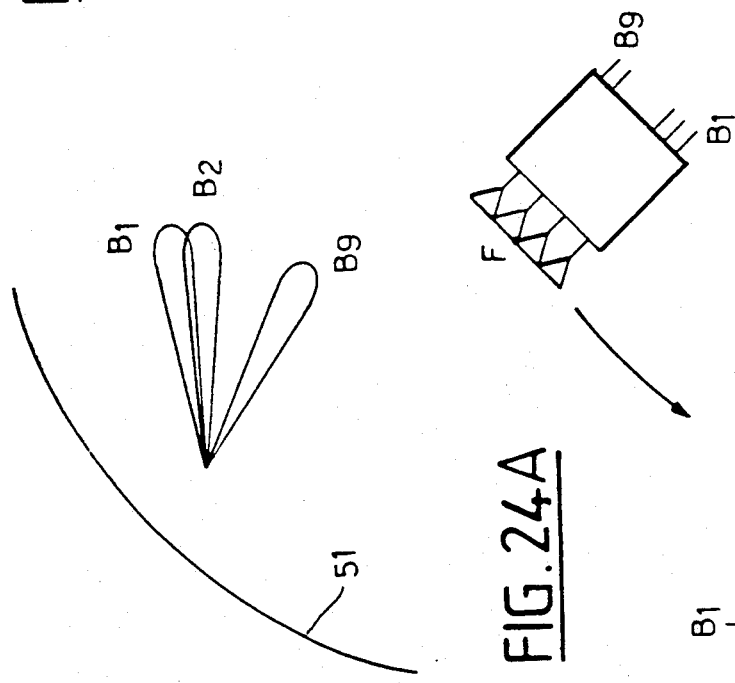
FIG.24A
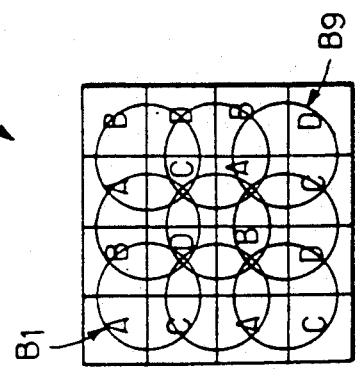

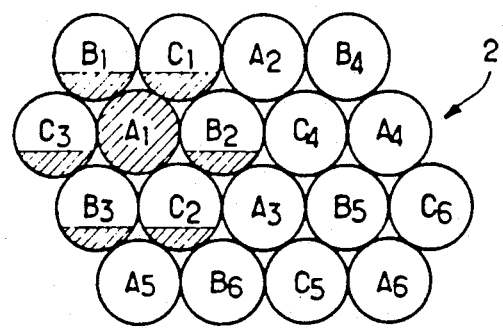
FIG. 25A
FIG. 25B
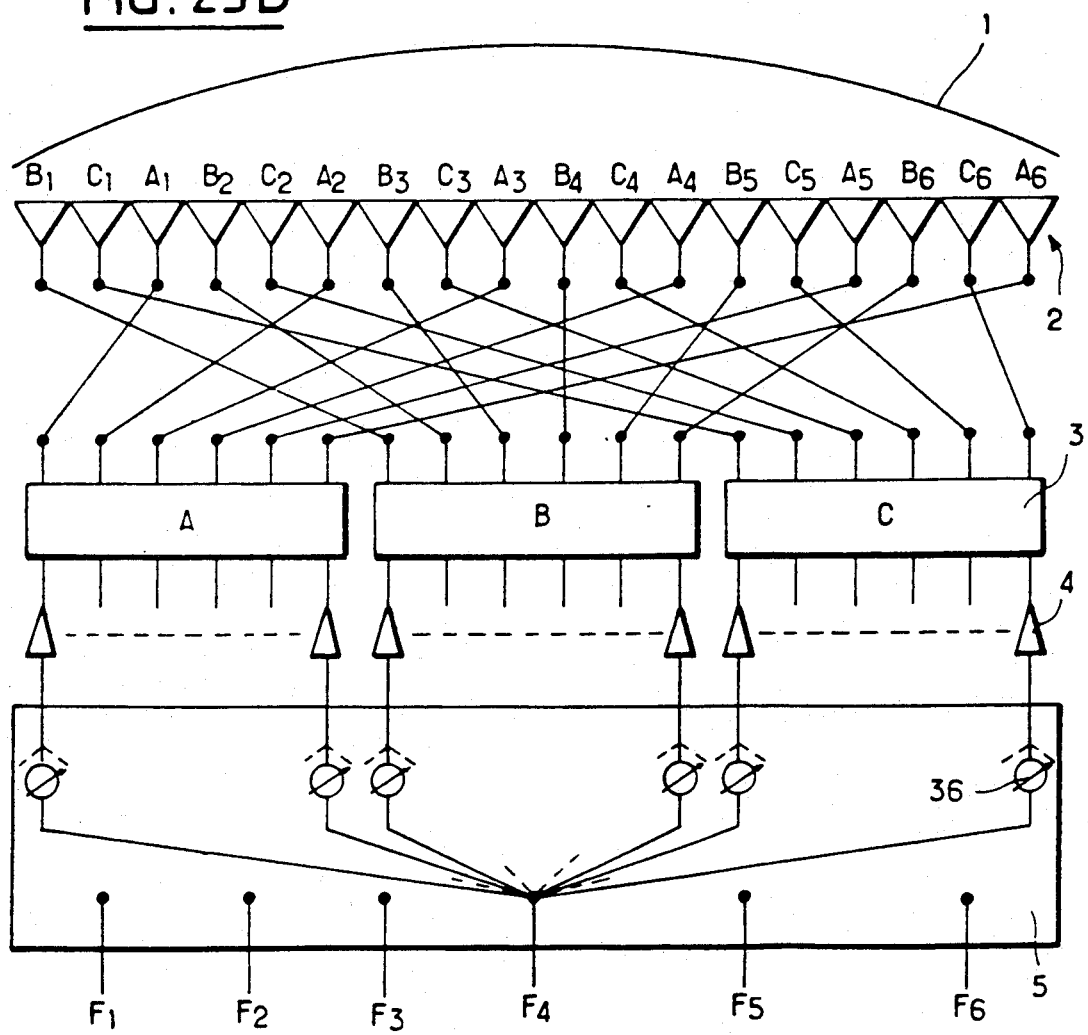

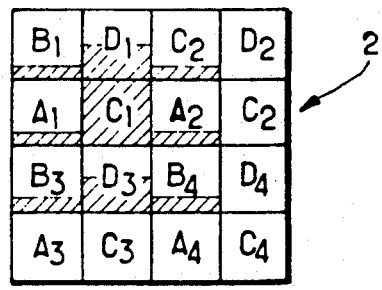
FIG. 26A
FIG. 26B
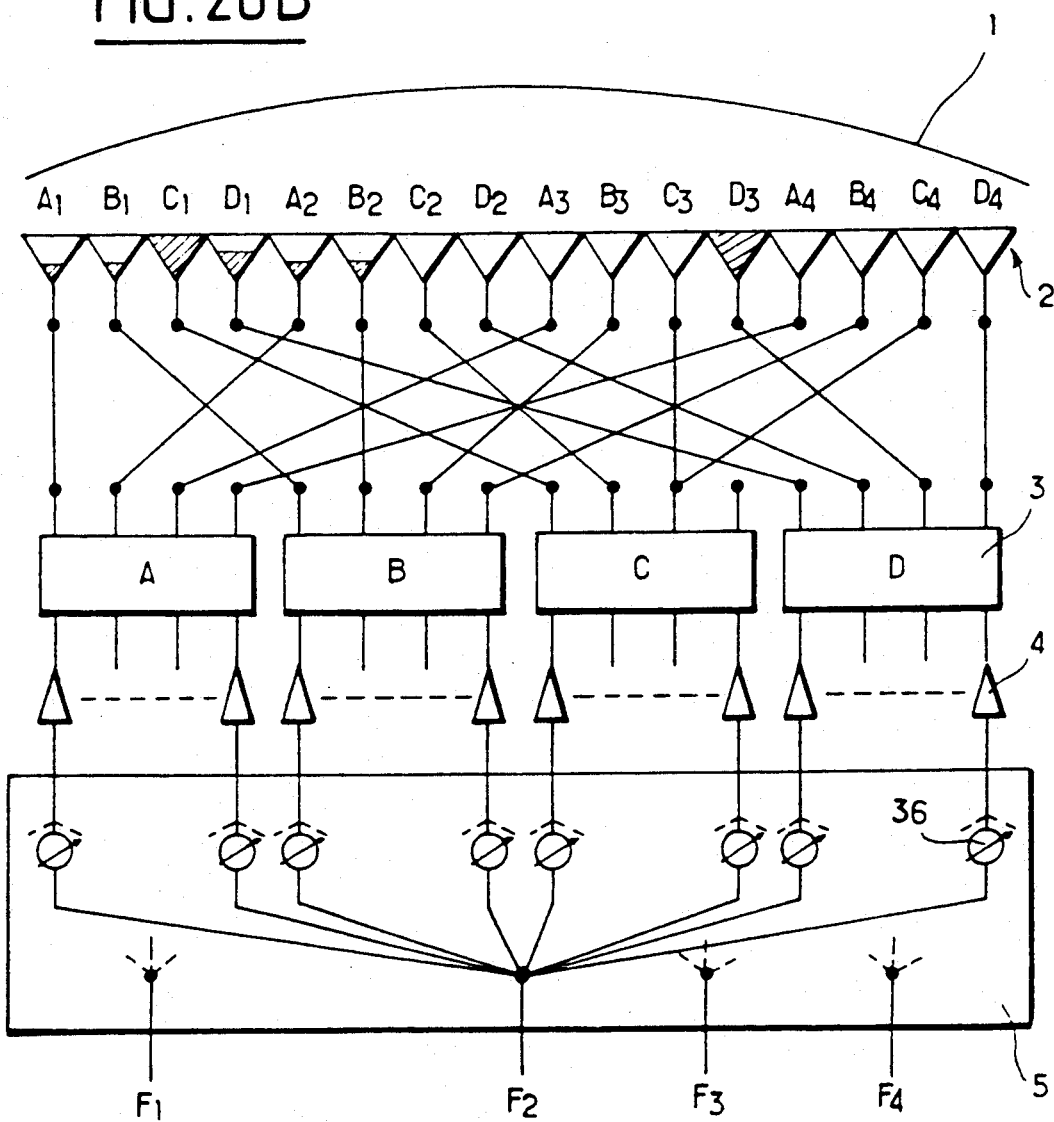

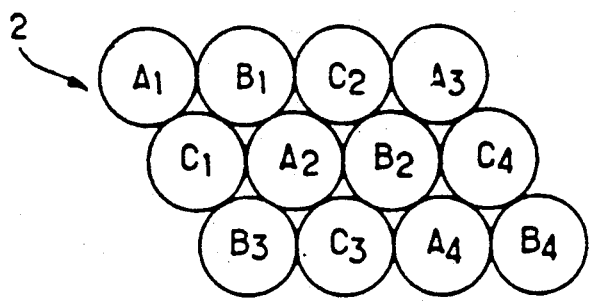
FIG.27A
FIG.27B
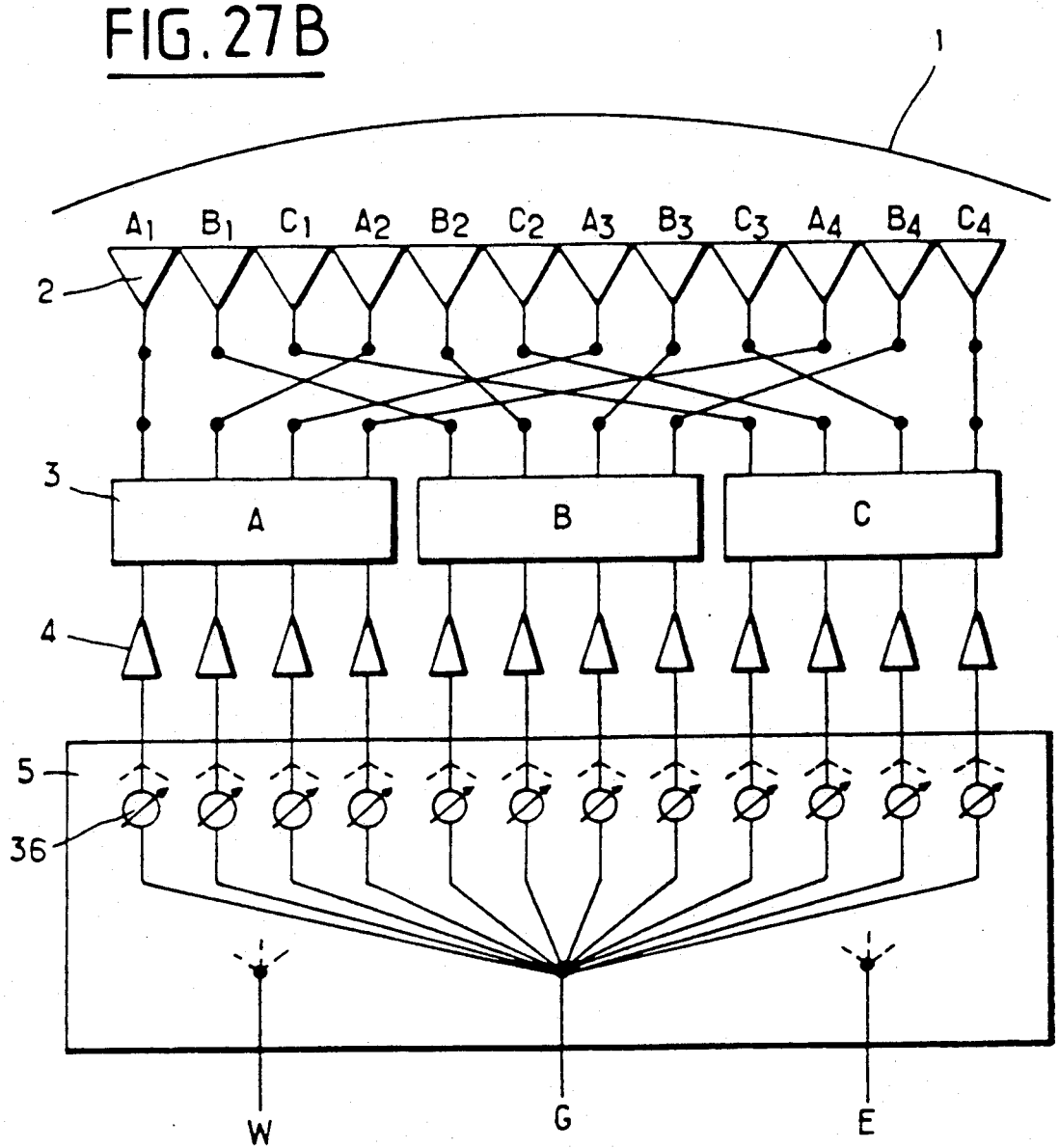

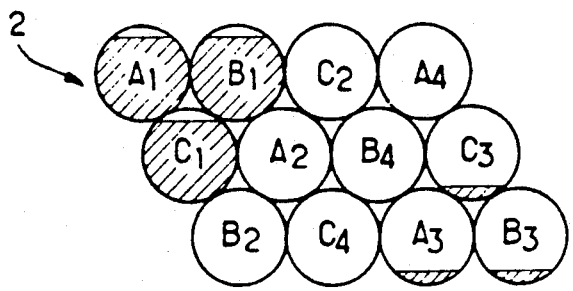
FIG. 28 A
FIG. 28 B
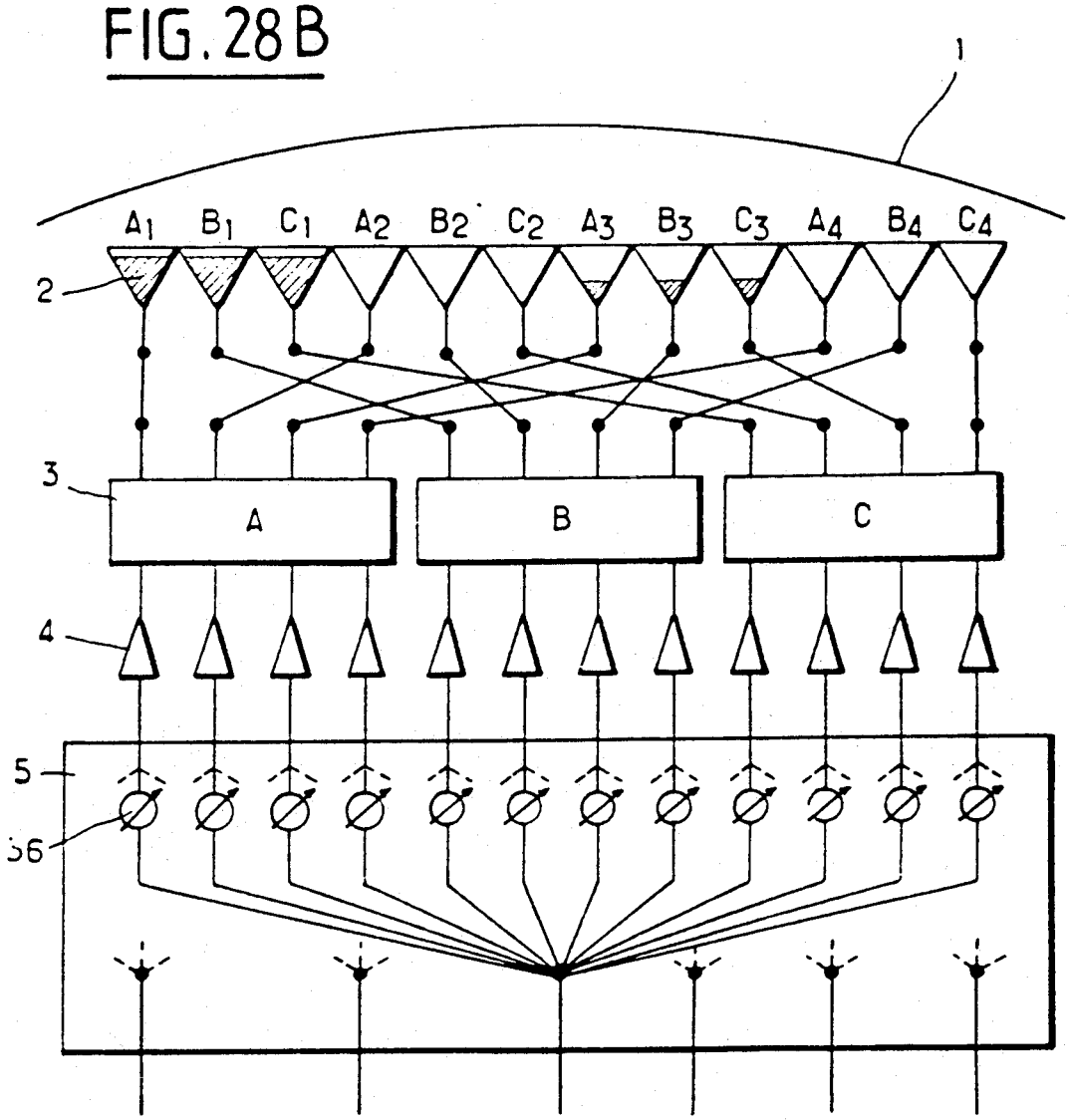

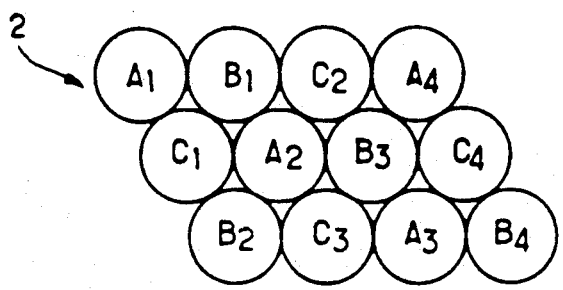
FIG. 29A
FIG. 29B
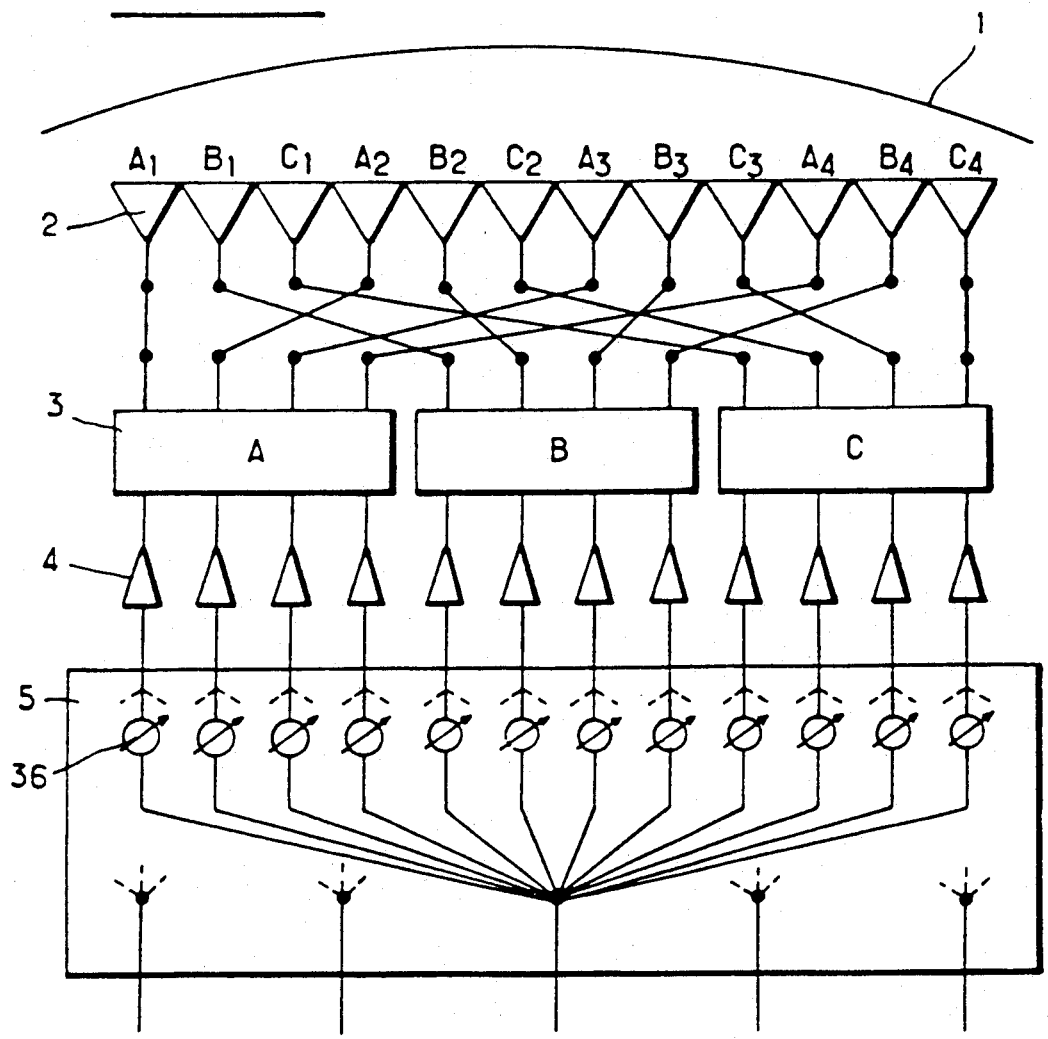

MULTIBEAM ANTENNA FEED DEVICE

BACKGROUND OF THE INVENTION

1. Field of the Invention

The invention concerns a feed device for multibeam antennas, that is to say a device for controlling the relative phase and amplitude of the various radiating elements constituting the feed array employed to illuminate the focussing devices in such a way as to constitute focussed antennas, the focussing devices comprising at least one reflector or lens.

2. Description of the Prior Art

Focussed antennas are used in satellite communications in particular. They can produce shaped or unshaped, fixed or reconfigurable, multiple beams.

Antennas of this kind must have the following properties:

maximal edge of coverage gain and a high potential of beam cross over, the potential for reconfiguration and for scanning of the beams by controlling only the phase of the signals passing through the amplification system, complete flexibility in terms of the allocation of radio frequency power to the beams, up to the limiting case of allocating all the power to a single beam, distributed power amplification using identical amplifiers, each beam receiving equal power from all amplifiers, to ensure efficiency in correct operation and tolerable degradation in the event of equipment failures, low sidelobe potential in the coverage area to enable frequency re-use; low sidelobes outside the coverage area, efficient use of the reflector to ensure minimal angular spacing between the beams or the areas in which the same frequencies are to be re-used with sufficient isolation, facility for dual polarization in some beams or in all beams.

Many solutions have previously been put forward to secure these various properties. In active array antennas, each radiating element contributes to all the beams and a low-level beam switching matrix enables an entire channel to be allocated to a beam. However, active array antennas have the following disadvantages: to achieve high gain it is necessary to use complex deployment; it is difficult to control the level of the sidelobes and of the grating lobes using identical amplifiers with fixed amplitudes; finally, the system is complex and of high mass.

Active array antennas magnified by one or more reflectors have also been proposed. In this case the feed array is disposed optimally between the reflector and its focus, which tends to spread the power of each beam over the major part of the feed array, with a small translation from one beam to another. The beams can be controlled by controlling the phase only and it is possible to use identical amplifiers excited uniformly as in an active array antenna. However, in systems of this kind featuring an offset relative to the focus, each beam uses only part of the reflector and the feed device, which leads to the use of larger reflectors than in focussed systems. What is more, controlling the sidelobes in coverage raises problems when phase control only is used and identical amplifiers are employed. Furthermore, spurious radiation occurs outside the coverage area, which leads to scanning loss and the possibility of interference problems. This system can provide only limited scanning, unlike normal arrays, and, finally, it is not possible to limit the use of dual polarization to one beam or to a few beams only without employing connections to all the individual feed elements.

The advantages of this second type of antenna reside in its simplicity and some of its disadvantages can be alleviated using reflector shaping.

Another proposal is to use the focussing reflector with a conventional multiport amplifier. A device of this kind is shown in FIGS. 1A and 1B.

An array 2 of 16 individual feed elements A, B, C, D, A', B', C', D', A'', B'', C'', D'', and A''', B''', C''', and D''' is disposed in the focal plane F of a paraboloid reflector 1. To generate a beam such as beam No. 1, marked F1, four elements A, B, C and D are used, excited uniformly. These elements may be horns, dipoles, microstrips or other types of radiating element. Beam No. 2, marked F2, adjacent beam No. 1 also uses four elements B, D, A' and C', the elements B and D being shared with beam No. 1; beam No. 3 uses the elements A', C', B', and D' and shares the elements A' and C' with beam No. 2, and so on. Thus four elements uniformly fed are used for each beam and the power allocated to a beam can be increased only by transferring more channels to these four beams using low-level switching at the corresponding beam input port.

The reflector is efficiently illuminated by four sources: the sidelobes are low and the close spacing of the beams which results from sharing feed elements results in a minimum drop in gain at the intersection of the four beam coverage zones.

The problem is to distribute and amplify the power from the beam inputs B1 through B9 to the 16 elements with minimum losses and using identical power amplifiers. It is also desirable for each beam to use all the amplifiers, each operating at the same optimal output power, independently of the power (number of channels) allocated to this beam at a given time.

A partial solution to this problem has been achieved recently through the use of a multiport amplifier fed by a low-loss beam forming matrix. As shown in FIG. 1B, the 16 elements are connected to a matrix of microwave circuits having 16 input ports and 16 output ports and which is so constituted that if its 16 input ports are fed with signals having equal amplitudes and subject to a particular phase law, all of the power will exit through a particular output port. Butler matrices are conventionally used for this purpose. These matrices are such that the particular phase laws mentioned above are linear or stepped with levels which are multiples of pi/16. A matrix of this kind comprises four layers of hybrid dividers and its distribution (or transfer) matrix is unitary (no losses) and orthogonal.

This 16×16 matrix is fed by 16 identical amplifiers connected to an identical 16×16 matrix operating at a low power level. In this configuration comprising two Butler or similar matrices back-to-back, one input port of the input matrix corresponds to one output port (feed element) of the output matrix. In this case the beams are obtained by means of a low-level divider which has 9 input ports and 16 output ports, each beam port being connected to four input ports of the low-level Butler matrix.

These arrangements enable the power for each beam to be divided between 16 identical amplifiers. However, this system has the following disadvantages:

Because there is for each beam not a single feed (A) but four (A, B, C, D), it is necessary to activate four input ports rather than a single input port to excite each beam (No. 1). For this reason the signals in each amplifier are constituted by superposing four signals from four different inputs.

These signals have the same amplitude but their relative phases are different in the different amplifiers with the result that for some beams there is an amplitude ripple between the 16 amplifiers, which therefore do not all operate at exactly the same level, with optimal efficiency. Note, however, that if multiple beams operate at different frequencis the overall ripple is reduced by the averaging effect.

Similarly, if a global beam must be generated covering all of the area, all of the input ports of the first Butler matrix are fed resulting in significant ripple at the amplifiers.

The two back-to-back matrices each employ four layers of eight hybrid couplers so that each amplified signal passes through four couplers, involving losses and sensitivity to coupler inaccuracies.

In a $2^N \times 2^N$ matrix, each signal passes through N couplers and the total number of couplers for both matrices will be $N \times 2^N$, the resulting complexity limiting the system to eight or 16 feeds at most.

Amplifiers with multiple inputs and multiple outputs and hybrid circuits with multiple inputs and multiple outputs are described in detail in, for example, the article by EGAMI and KAWAI in IEEE JOURNAL ON SELECTED AREAS IN COMMUNICATION, Vol. SAC-5 No. 4, May 1987, pages 630 through 636.

Other solutions have also been proposed; one proposal, for example, is to use lenses instead of the multiport amplifier, but these devices have higher losses and higher mass. However, such devices could be used to create a large number of beams at higher frequencies, as in this case matrix systems are too complex and too lossy.

U.S. Pat. No. 4,901,085 in the name Spring et al., filed Sept. 23, 1988 and published Feb. 13, 1990, describes a configuration for a multibeam antenna feed system comprising a plurality of small and preferably identical hybrid matrix power amplifiers (HMPA).

Each HMPA, which comprises an input matrix and an output matrix interconnected by power amplifiers, is disposed between a low-level beam forming network and the radiating elements.

This configuration comprises a set of amplifiers disposed between the input and output matrices characterized by mirrow symmetry. A structure of this kind, which implies duplication of the matrices, is therefore relatively complex, bulky and heavy (important characteristics in the case of a satellite antenna).

Secondly, in the configuration described in this patent, the beam forming network connects each beam selector port to certain HMPA input ports. The amplifiers are then not always loaded identically, reducing the efficiency of the system, as can be seen from Tables 1, 2 and 3 of the specification of this patent.

Finally, the system described by this prior art document does not allow pointing of the beam while maintaining a constant loading of the amplifiers, which is a highly desirable characteristic for satellite communication antennas.

The present invention concerns a multibeam antenna feed device with which all these disadvantages can be alleviated and all of the properties mentioned above can be achieved.

SUMMARY OF THE INVENTION

The present invention consists in a multibeam antenna feed device comprising reflector or lens means cooperating with Ne feed elements and providing Nb beams, each generated from a sub-group of feed elements some of which are shared among overlapping beams, wherein said device comprises:

a set of Nc hybrid multiport power dividers, each having an equal number of input ports and output ports, said number being a power of two, or three or a product of a power of two and a power of three, and each including an orthogonal and unitary distribution matrix, said output ports of said dividers, which number being Na such that Na=Ne, are connected to said Ne elements, or to loads whenever Na>Ne, so that, for each beam, each divider feeds one of the feed elements contributing to these respective beams, a set of Na amplifier modules, each input port of each divider being connected to a module, each module comprising a power amplifier for transmission and/or a low-noise amplifier for reception, and all amplifiers essentially operating at the same optimum nominal level whenever the relative load of the beams changes, and a beam forming network, with Nb input ports and Na output ports, in which each input port is connected to all the output ports with appropriate insertion phase-shifts for each beam, the Na output ports being connected to the Na amplifier modules connected between the dividers and the beam forming network.

This arrangement makes it possible to obtain the results or porperties mentioned above using the minimum of component parts so that the overall size and cost can be reduced.

According to advantageous characteristics of the invention:

the power dividers are formed of Nc similar matrices of which some at least are of different orders, each of the feed elements of a group contributing to a given beam being connected to a different power divider;

these Nc power dividers are formed of matrices with the same order P equal to the power of two, of three, or to a multiple of these powers, which is equal to or immediately higher than the ration Ne/Nc, and the beam forming network comprises Nr=P×Nc outputs connected to the input ports of the power dividers through amplifiers.

Amplification may additionally be provided at the beam forming network input port level.

The unitary orthogonal matrix power dividers are advantageously multiport hybrid couplers; these power dividers may also be Butler matrices or similar matrices.

The beam forming network comprises phase-shifting means connected between each input port and the output ports of the beam forming network adapted to adjust the position and/or the shape of the sidelobes of the beams. These may be fixed or variable phase-shifters, of the analog or digital type; the beam forming network may also be a digital network.

The beam forming network can also be an optical beam forming network.

The feed device in accordance with the invention may be associated with a focussing reflector or a focussing lens or a multireflector system such as lenses or a combination of lenses and reflectors.

Other advantages and characteristics of the invention will emerge from the following description given by way of non-limiting example only with reference to the appended diagrammatic drawings in which reference numbers used in more than one drawing denote functionally similar parts.

BRIEF DESCRIPTION OF THE DRAWINGS

FIGS. 2 through 4A and 4B show an array antenna feed device in accordance with the invention.

FIGS. 5, 6A and 6B, 7A and 7B, 8A and 8B, 9A through 9C, 10A and 10B, 11A and 11B, 12A and 12B, 13A and 13B, 14A and 14B, 15A and 15B, 16A and 16B, 17A and 17B, 18A and 18B, 19A and 19B show other embodiments of the invention for a different number of feed elements and/or power dividers.

FIG. 20 shows a distribution of the beams and a typical coverage area for a reflector antenna operating at 1.6 GHz and covering Europe.

FIGS. 24A through 24C are explanatory diagrams comparing the invention with a conventional feed system.

FIGS. 25A and 25B, 26A and 26B, 27A and 27B, 28A and 28B, 29A and 29B show further embodiments of the invention.

DETAILED DESCRIPTION OF THE PREFERRED EMBODIMENTS

Figure 1A:
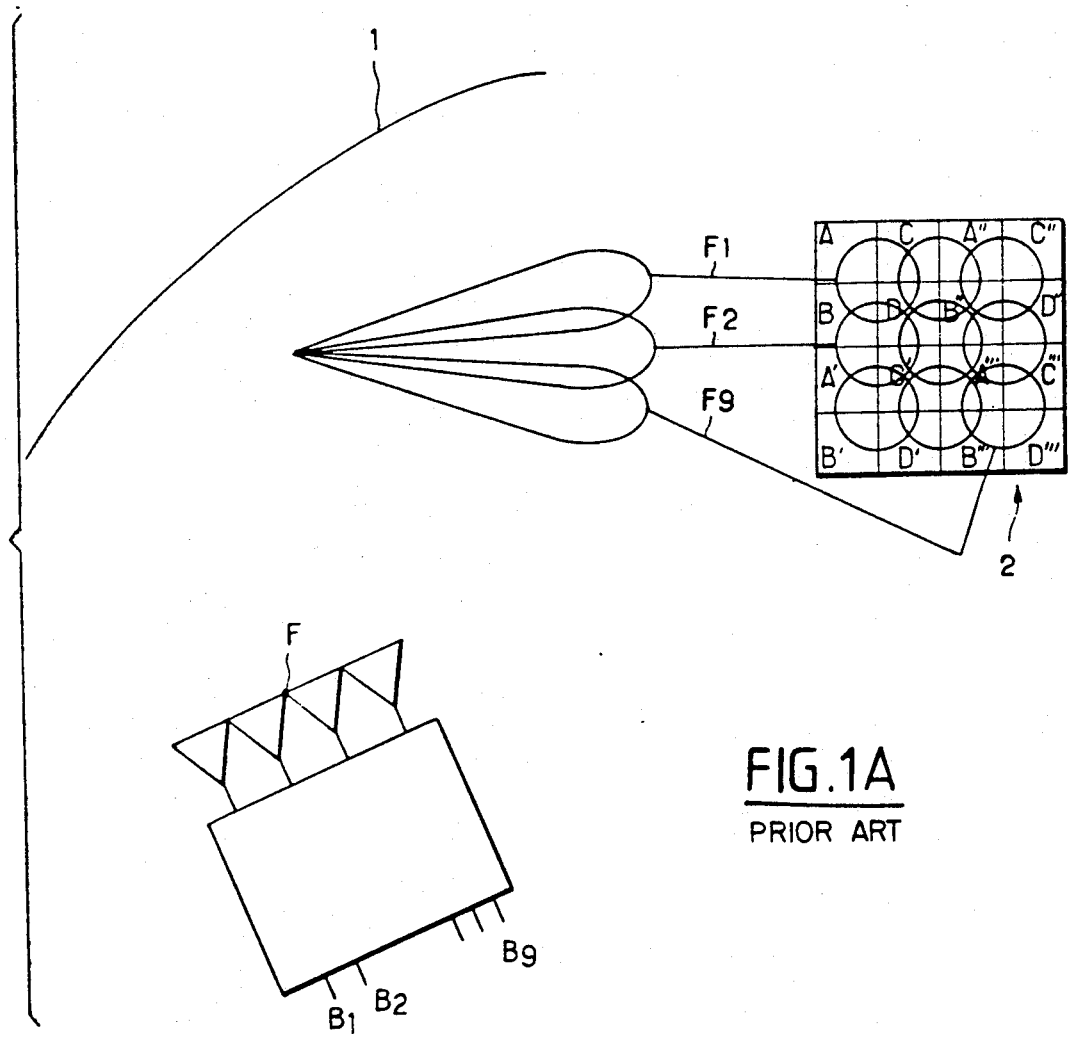
FIGS. 1A and 1B show a prior art feed device comprising a focussing reflector associated with a conventional mulitport amplifier.
Figure 1B:
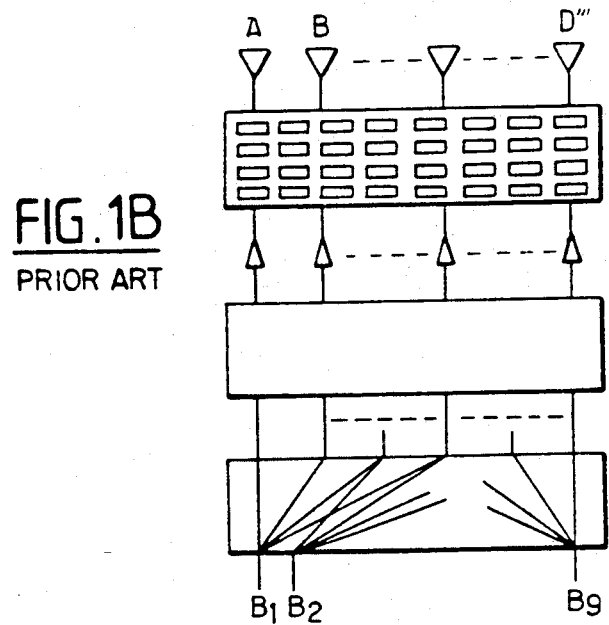

FIGS. 2 through 4A and 4B show the principle of the invention for the same case as that of FIGS. 1A and 1B.

In this example a focussing device 1, usually a paraboloid reflector, is fed by a feed array 2 comprising Ne (Ne=16 in this example) feed elements A, A', A'', A''', B, B', B'', B''', C, C', C'', C''', D, D', D'', D''', placed at the focus F of the reflector 1 in such a way that each beam is generated by Nc (Nc=4 in this example) elements, adjacent beams having at least one element in common (two in this example).

Figure 3:
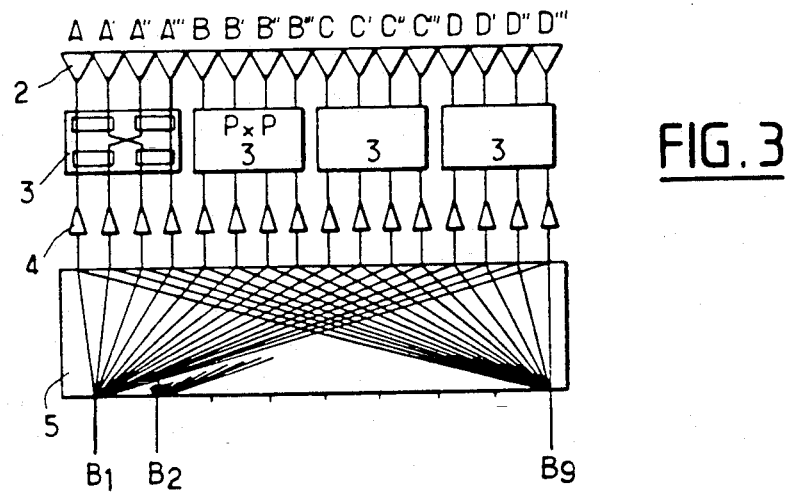

According to the invention, the feed device shown in FIG. 3 comprises a number equal to Nc (four in this example) unitary orthogonal matrix dividers 3. These are square Pth order matrices and P is equal to the power of two equal to or immediately higher than the ratio Ne/Nc; in the example shown, Ne=16, Nc=4 and P=4.

These orthogonal matrix dividers 3 with P inputs and P outputs are such that if one of their input ports is excited all of their output ports supply equal power without losses other than ohmic losses, which is why they are called unitary matrices. If another input port is excited in isolation the phases of the signals at the output ports are such that the complex scalar products of the output vectors are all equal to zero; this is why they are called orthogonal matrices.

Figure 4B:
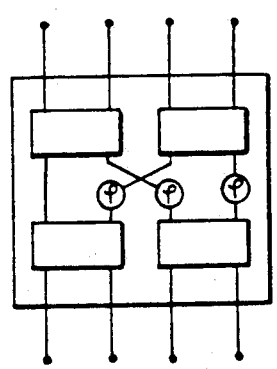
Figure 4A:
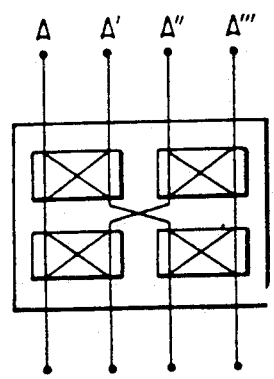
Figure 2:
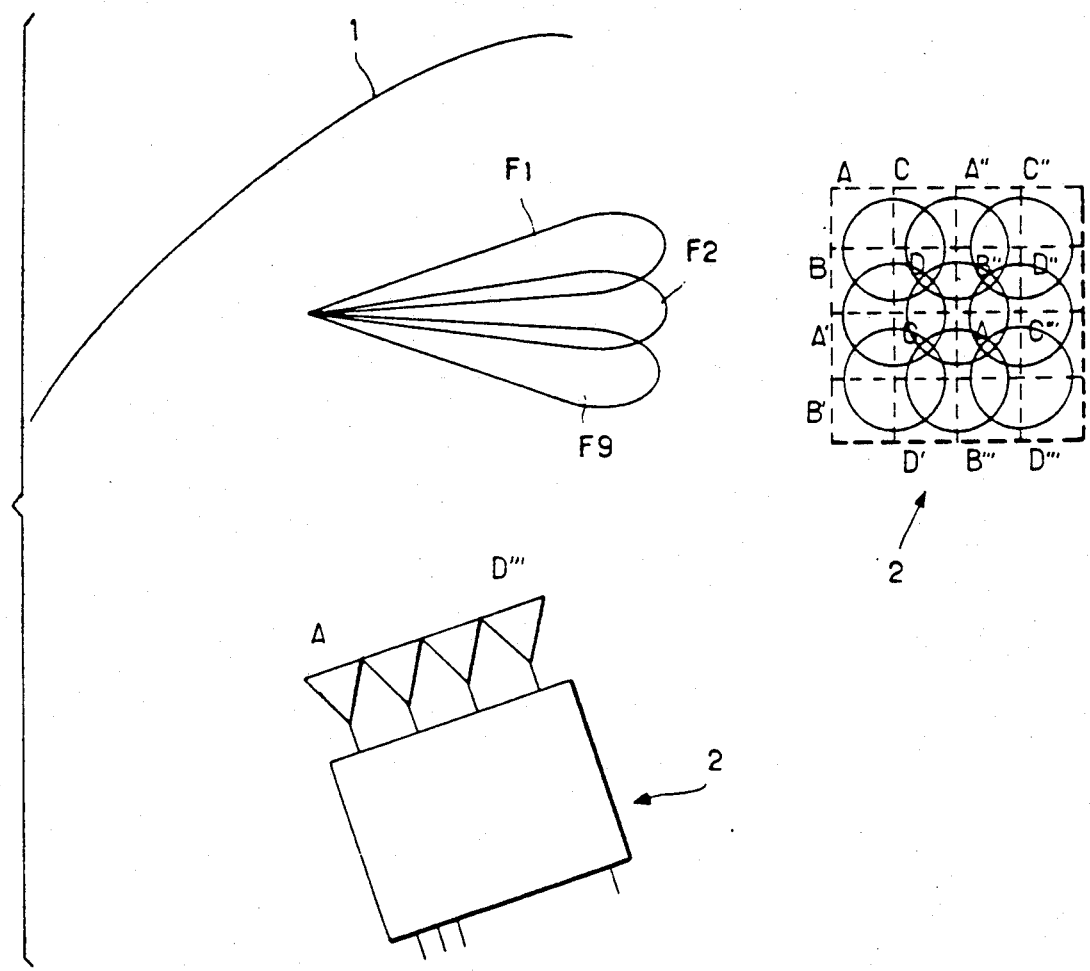

FIG. 4A shows a prior art 4×4 orthogonal unitary matrix divider. Each input is connected to a 3 dB hybrid coupler which has four terminals and which divides the input signal by two. The two signals obtained in this way are fed to two different 3 dB four-terminal hybrid couplers which again divide by two and phase-shift the signals to the output at which each output coupler is connected to two feed elements. Typical matrix dividers of this kind are used in conventional multiport amplifiers and are described in the article by EGAMI and KAWAI mentioned above. Other arrangements can obviously be used, e.g. with phase-shifters and couplers (identical or not), as shown on FIG. 4B. The important point is that the matrix divider supplies power to a specific feed element in each group of sources generating a beam, the element A for the matrix A, the element B for the matrix B, etc.

The matrix dividers are fed by a set of identical conventional amplifiers 4, of which there are 16 in this example. The output power of each of the amplifiers 4 is divided by the matrix dividers between the feed elements of all the beams.

The power amplifiers are fed by a beam forming network 5 which has the same number of input ports as the required number of beams, nine in the example shown. The beam forming network 5 is a low-level device and may therefore be subject to losses; it can operate either at the same frequency as the amplifiers or at a lower intermediate frequency, in which case a frequency converter is required on the input side of each power amplifier.

FIG. 5 shows an embodiment in which the matrix power dividers 3 are not all of the same order.

In the configuration of FIG. 5 three elements A, B and C contribute to a beam but, differing in this respect from the previous examples, not all the sources receive the same power. In the example of FIG. 5 the elements A typically receive twice as much power as each element B or C, as symbolically represented by the different shaded areas of the triangle symbols for the elements 2, the amount of shading being proportional to the power received.

The configuration shown produces three elliptical beams F1, F2 and F3. The dividers B and C are 2×2 matrices and the divider A is a 4×4 matrix, one unused output of which is terminated in a load.

Of course, other devices with different numbers of second, third, fourth, sixth, eighth, etc order dividers are feasible, depending on the shape and the power distribution of the various beams to be obtained.

FIGS. 6A and 6B show a specific embodiment in which the power dividers are components whose orders are powers of three or of common multiples of powers of two and three (in other words P=2, 3, 4, 6, 8, 9, 12, 16, 18, etc).

In this example three adjacent feed elements A, B, C contribute to the beam (as shown in FIG. 6A).

These three elements typically receive the same power from third order power dividers as shown in FIG. 6B.

The third order power dividers are, for example, of the type described in an article by J. P. SHELTON and K. S. KELLEHER entitled "Multiple beams from Linear Arrays" published in the IRE TRANSACTIONS ON ANTENNAS AND PROPAGATION—March 1961, pages 154 through 161.

In this example seven beams F1, ... Fi, ... F9 are available but other devices using sixth, ninth, 12th, 18th, etc order dividers based on elementary second and third order dividers are feasible.

In this embodiment, as in the others, it may be advantageous to adjust the phase of the beam forming network 5 output signals by means of fixed or variable phase-shifters 36 in order to optimize the position and/or the shape of the sidelobes of each beam.

FIGS. 7 through 19 show other embodiments of the invention with different values of the parameters Ne, Nc and Nb.

In the case of FIGS. 7A and 7B, the number Ne of elements is equal to eight and the number Nc of elements per beam is equal to two; in this case the order P of the matrices 3 is equal to four.

In the case of FIGS. 8A and 8B, the number Ne of elements is equal to 16 and the number Nc of elements per beam is equal to two; in this case the order P of the matrices 3 is equal to eight, in order words two to the power three.

Figure 9A:
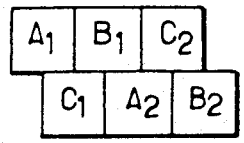
Figure 9B:
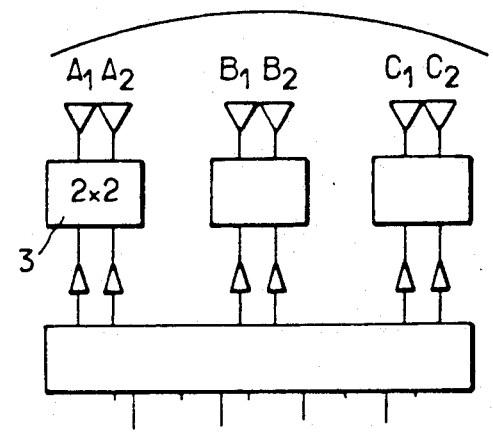
Figure 9C:
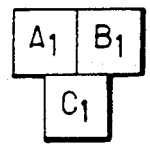

In the case of FIGS. 9A through 9C, the number Ne of elements is equal to six and the number Nc of elements per beam is equal to three; consequently, the matrices 3 are second order matrices.

Figure 10A:
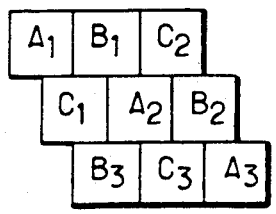

In the case of FIGS. 10A and 10C, the number Ne of elements is equal to nine and the number Nc of elements per beam is equal to three; in this case the order P of the matrices 3 is equal to four, in other words to the power of two immediately higher than the ratio 9/3; however, three third-order matrices could be used as well.

In the case of FIGS. 11A and 11B, the number Ne of elements is equal to 12 and the number Nc of elements per beam is again equal to three; in this case the order P is equal to four, in other words to the ratio 12/3.

In the case of FIGS. 12A and 12B, the number Nc of elements per beam is still equal to three, but the number Ne of elements is equal to 24; in this case the order P of the matrices 3 is equal to eight in other words to the ratio 24/3.

FIGS. 13 through 15 show configurations in which four elements are used to form each beam; in the case of FIGS. 13A and 13B, Ne=8, Nc=4 and the matrices 3 are therefore second order matrices.

In the case of FIGS. 14A and 14B, Ne=12, the ratio Ne/Nc is equal to three, and consequently the order P of the matrices 3 is equal to four.

Finally, in the case of FIGS. 15A and 15B, 16 elements are used and the ratio Ne/Nc is therefore equal to four which is therefore also the value of the order P of the matrices 3.

In the case of FIGS. 16A and 16B, the number of elements is equal to 32 and the number of elements per beam is equal to four; consequently, the order P is equal to two to the power three, that is to say eight.

In the case of FIGS. 17 and 18, seven elements are used to form each beam. In the case of FIGS. 17A and 17B, the number of elements is equal to 13 and consequently the order P is equal to two which is just slightly greater than the ratio 13/7.

Figure 18A:
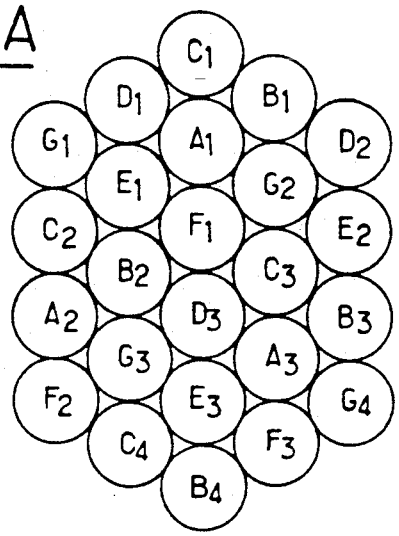
Figure 18B:
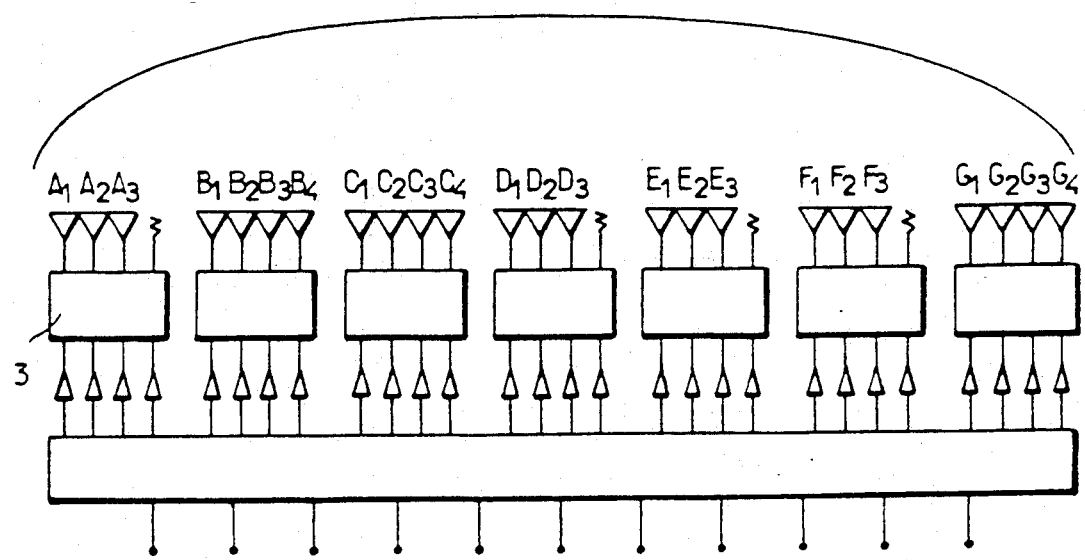
Figure 19:
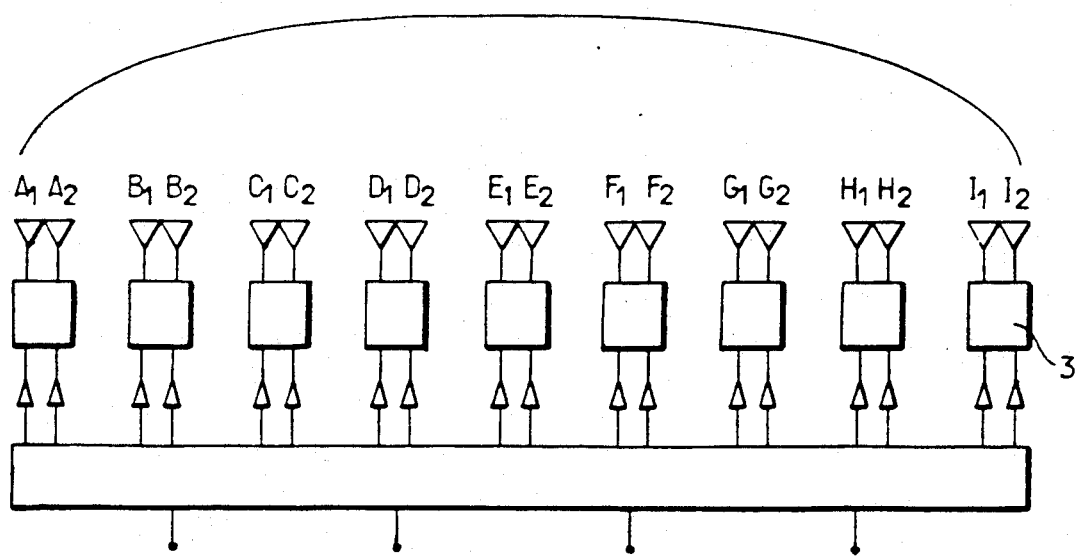

In the case of FIGS. 18A and 18B, Ne=24, the ratio Ne/Nc is equal to 27/7 and the order P is equal to four.

FIGS. 19A and 19B show a final configuration mode in which nine elements are used to form each beam; the number of elements is equal to 18; consequently the order P of the matrices 3 is equal to two.

Figure 10B:
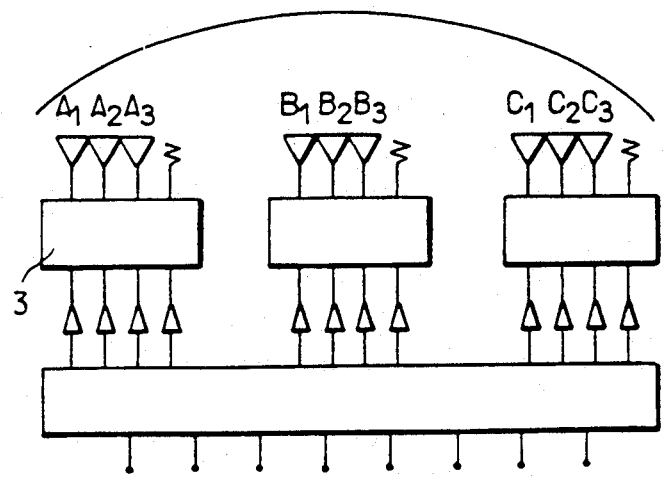

In the configurations of FIGS. 10, 14 and 17, one output of some of the matrix dividers 3 is not connected to an element but to a load. However, it will be seen that even in this case the invention makes it possible to implement a configuration comprising less elements than prior art configurations.

FIG. 20 shows one example of an application of an array antenna fed in accordance with the present invention. The configuration of the beams and the coverage area are designed to cover Europe using a reflector antenna in accordance with the present invention and operating at 1.6 GHz. In this arrangement the area Z1 is covered by six beams and the area Z2 by eight beams. Two or more additional beam positions are available for reconfiguration; in total there are twenty six beam positions for scanning beams with a high crossover gain.

Figure 21A:
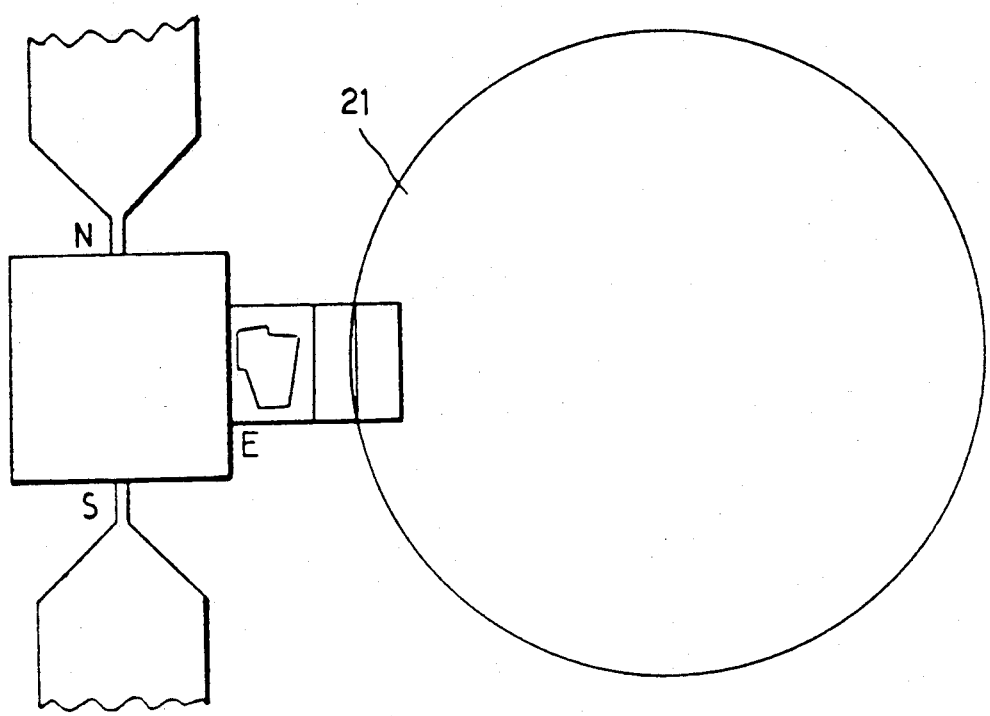
FIGS. 21A and 21B show the configuration of the reflector and of the feed elements for the configuration of the beams of FIG. 20.

FIG. 21A shows the rear 21 of the reflector which has a diameter of 5 500 mm, a focal length of 3 125 mm and a spacing of 750 mm. The taper of the illumination at the edges of the reflector 21 is from $-10$ to $-12$ dB. The reference letters N, S and E respectively denote the North, the South and the East.

The half-power beam width is 2.3" and the peak directivity is 37.0 dB. The cross over level between the fixed beams is 3.0 dB (directivity 34.0 dB), adjacent fixed beams sharing one feed element. The cross over level between beams that can be scanned (and if possible with additional other fixed beams) is $-1$ dB (directivity 36.0 dB).

The sidelobe level is in the order of 25 dB. Reconfiguration can be effected by transferring power to beams with a footprint in the coverage area. Orthogonally polarized beams can be provided in high traffic areas, for example.

Figure 21B:
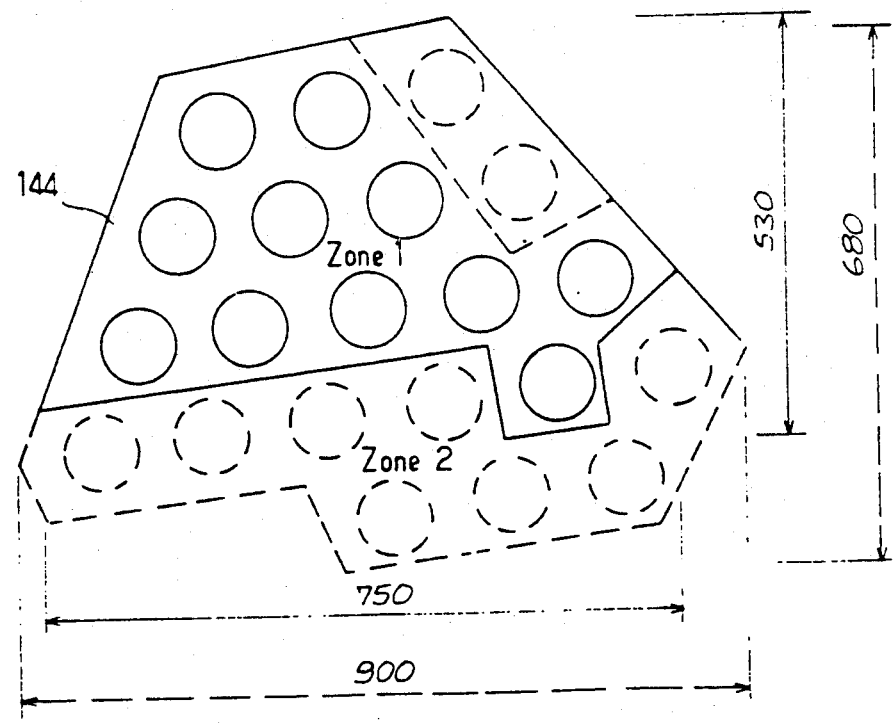

Referring to FIG. 21B, the distance between the centers of two adjacent elements is 144 mm. In the conventional way the normal to the feed array is directed towards the center of the reflector. Solutions with the feed array along the wall of the spacecraft are possible but at the cost of degraded performance and increased complexity. For the area Z1 the feed elements shown in solid line are used; the feed elements used for the area Z2 and for reconfiguration in extended coverage areas (towards the East in the present case) are shown in dashed line.

Figure 22:
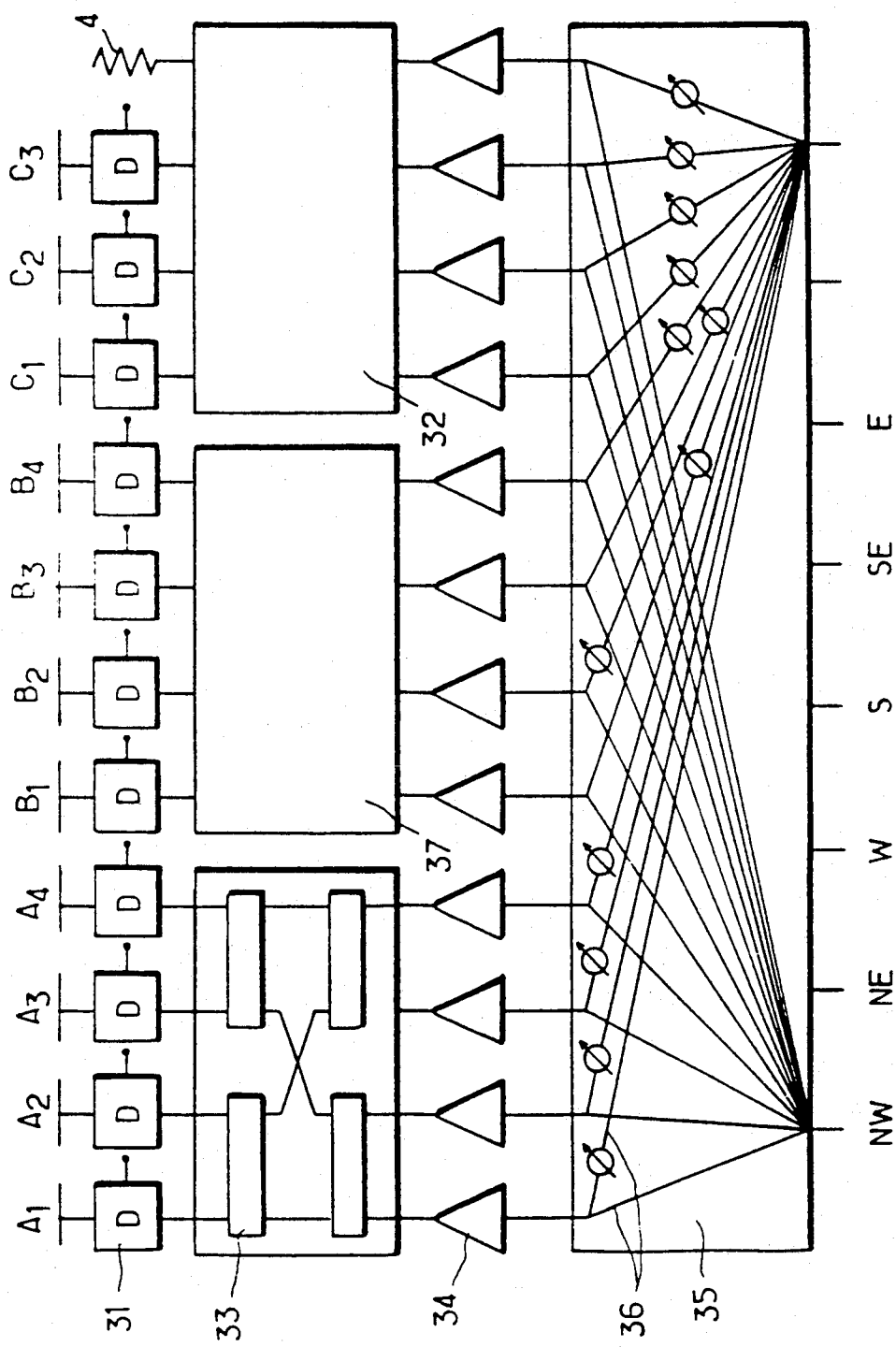
FIGS. 22 shows a feed array for obtaining the solid line beams of FIG. 20 (Europe only).

FIG. 22 shows a configuration with 11 feed elements and an adjustable beam. In this configuration each beam uses an element A, an element B and an element C. The duplexers 31 at the receive terminals are connected to low-noise amplifiers which are in turn connected to a beam forming device operating at the radio frequency (RF) or at an intermediate frequency (IF) and not shown in the figure.

It is also possible to use "auto-duplexing" elements subject to a few modifications but without changing the basic principle. The three low-loss multiport hybrid matrices 32 each comprise four conventionally implemented hybrid couplers 33 using the TEM (transverse electric and magnetic field) line technology. The unused terminal No. 4 of the matrix connected to the elements C is terminated in a load and because it is not excited there is no loss of power. Each beam uses all of the twelve identical amplifiers 34, with redundancy if possible. The failure of one amplifier introduces a power loss of 0.4 dB and, in a small part of the coverage area of each beam, a loss of gain which does not exceed 1.0 dB in the worst case. This also degrades the isolation between beams with a value of up to 16 dB in part of the beam.

The amplifiers may be overrated or redundancy may be employed to compensate for such defects. Unlike what happens in a group of feeds with overlap incorporating conventional type multiport amplifiers, there is no non-uniformity in the amplifier (at the input) and therefore at the outputs which generate the beam. All the amplifiers can be used with their maximum efficiency. The low-level beam forming network 35 can operate at the radio frequency using microstrip lines, for example, which is feasible using MMIC type components.

Fixed phase-shifters are used on the feed lines for the fixed beams. Two-bit variable phase-shifters 36 make it possible to generate controllable beams overlapping at −1 dB (directivity 36.0 dB) level. An overall beam using all 11 elements can be generated; this will not cause any ripple at the amplifiers if multiport hybrid circuits are used.

Of the last two inputs of the forming network, one is used for the global beam and the other for the beam that can be varied.

Figure 23:
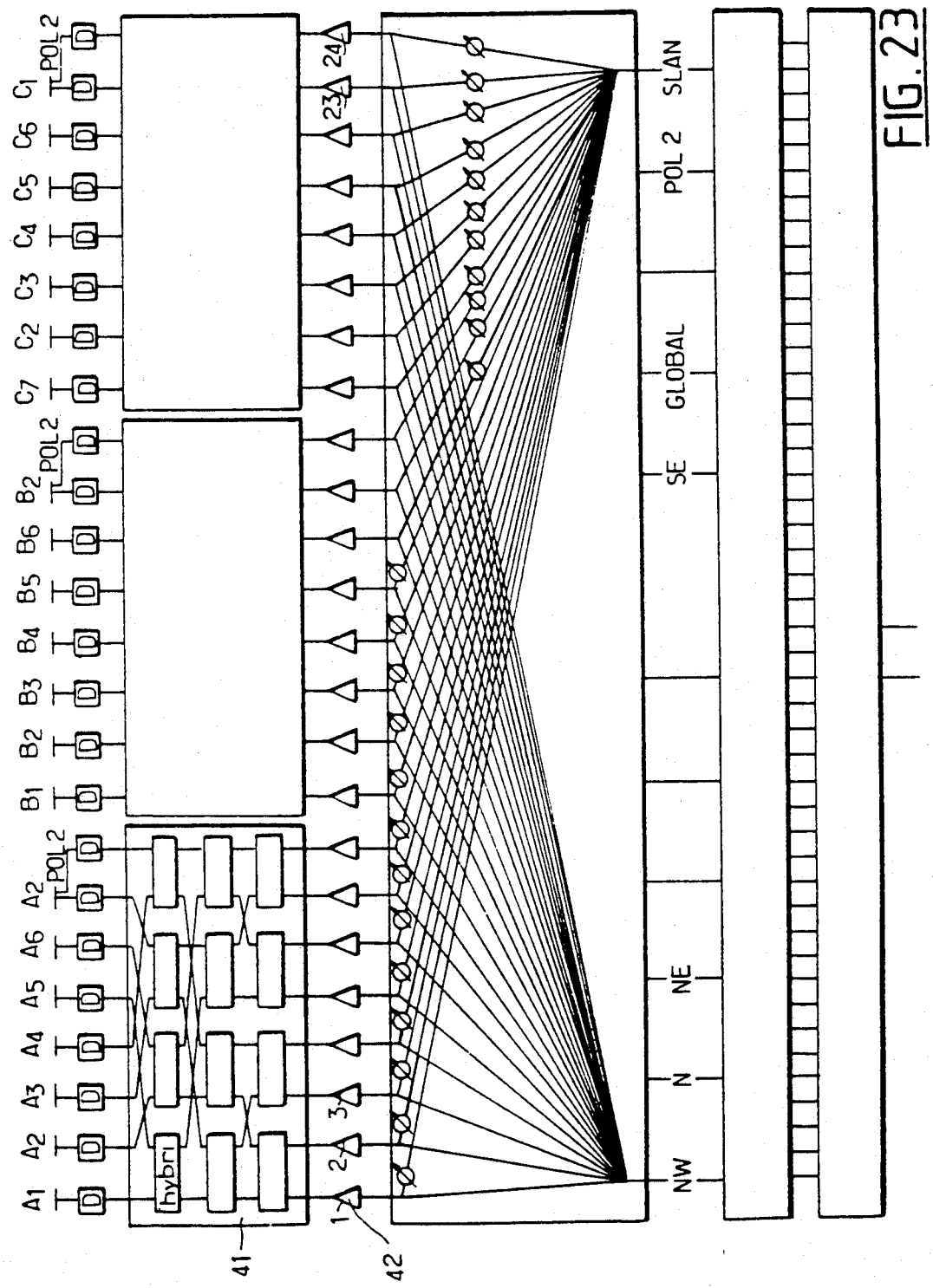
FIG. 23 shows a feed system for obtaining all the beams of FIG. 20 (extended coverage).

FIG. 23 shows a feed configuration for a widened coverage array antenna operating at 1.6 GHz. In this configuration 21 elements are used of which three can be excited with two polarizations. The three low-loss multiport hybrid matrices 41 each comprise 12 hybrid couplers. All the outputs are used and three are employed to provide an orthogonal polarization beam.

In this case also each beam uses all of the 24 identical power amplifiers 42. The failure of one amplifier introduces a power loss of 0.2 dB and a local loss of gain in each beam not exceeding 0.5 dB in the worst case. The loss of one amplifier causes degradation in the isolation of the beams which can be up to 22 dB in part of the beam. It is possible to keep the effects of isolation tolerances relating to the components of the matrix divider below 35 dB in narrowband operation. The effects of input signal amplitude and phase errors are acceptable, as explained in the previously mentioned article by EGAMI and KAWAI.

Reconfiguration is achieved by shifting channels at the input ports of beams with footprints which cover the required area. Controlling the beam using two-bit phase-shifters only results in a cross over drop of 1 dB at most between the discrete beam positions.

FIGS. 24A through 24C show the advantages of the invention compared with a conventional multiport amplifier solution. The system of FIG. 24A includes a focussing optical system 51, for example a portion of a paraboloid, used with a 4×4 feed array. In the conventional solution of FIG. 24B the total number of couplers used is 64, the total length of lossy lines is approximately 16 wavelengths for the highest power, and significant ripple results at the amplifiers due to the sharing of the feed elements.

In the conventional device of FIG. 24B, a divider 61, 62 is of the 16×16 type and uses 32 couplers.

In the solution in accordance with the present invention shown in FIG. 24C the same configuration uses only 16 couplers in all, the total length of lossy lines being approximately four wavelengths; there is no ripple at the amplifiers and, finally, each beam uses all the uniformly loaded amplifiers and one feed from each group (A, B, C or D).

There will now be described with reference to FIGS. 25 through 29 embodiments in which a plurality of elements 2 is connected to the same power divider 3 in order to improve the efficiency and/or the shape and/or the sidelobes of the beams.

In the case of FIGS. 25A and 25B, seven adjacent elements contribute to each beam, the central element receiving three times more power than each of the other six. This makes it possible to improve the efficiency (reduced spillover) and the sidelobes of each beam.

In this example six beams are available and to this end three power dividers in the form of 6×6 couplers are used. Of the seven elements used for each beam, three are connected to one of the dividers, three are connected to another divider and one is connected to the third divider, which makes it possible to obtain the required distribution of power (symbolically represented in FIG. 25A by the different size shaded areas).

Note that fixed or variable phase-shifters 36 may additionally be provided to orient the power to one or three outputs of a divider.

The principle of the embodiments of FIGS. 26A and 26B is the same as in the previous example, but in this case nine adjacent elements contribute to a beam. The central element receives twice as much power as the nearest four elements and four times as much power as the other four elements, in order words those on the diagonal of the square (see FIG. 26A). This achieves an improvement in efficiency and in the sidelobes.

In this example four beams F1 through F4 are available and it will be noted that, as in the previous case, the amplifiers 4 are nominally uniformly loaded.

In the example of FIGS. 27A and 27B several of the elements contributing to the same beam are connected to the same divider, essentially to optimize the shape of each beam.

In this example the elements A1, A2, B1, B3, C1 and C4 (see FIG. 27A) contribute to the West beam (W), the others to the East beam (E), and all the elements contribute to the overall beam (G).

The phase of signals in the beam forming array 5 is shifted by means of phase-shifters 36 to achieve the required distribution at the output of the power dividers. Once again, all the amplifiers 4 nominally operate at the same power level.

With respect to the elements, their individual phases may be adjusted in particular by selecting the length of their feed cables, their amplitudes being varied by adjusting the phase-shifters 36.

In the example of FIGS. 28A and 28B several of the elements contributing to the same beam are connected to the same divider, essentially to reduce the sidelobes in some areas.

Three elements essentially contribute to each beam (the elements A1, B1 and C1 for the beam 1, for example), but a reduced number of external elements (here A3, B3 and C3) may also be excited at a low level to reduce secondary radiation in the corresponding areas.

To this end it is sufficient to vary in the beam forming network 5 the phases between the beam input and the outputs, the levels of A3, B3 and C3 being variable independently in this example.

Finally, FIGS. 29A and 29B show a device in which the position and/or the shape of the beams is variable by varying the phase of the signals by means of variable phase-shifters 36 incorporated in the beam forming network 5.

Thus to change from the beam A1-B1-C1 to the beam B1-C1-A2, the power of matrix A is transferred progressively from the output A1 to the output A2 by adjusting the phases of the signals at the input to the matrix A for this beam.

It is also possible to change from the beam A1-B1-C1 to a broader beam A1-B1-C1-A2-B2-C2 by varying the phases of the signals in the beam forming network 5.

This technique also makes it possible to reconfigure more than one beam at a time.

I claim:

1. A feed device for a multibeam antenna, said antenna providing Nb beams by means of Ne feed elements cooperating with a focusing means, each of the beams being generated by a sub-group of Nc feed elements, the feed elements being shared among overlapping beams, said feed device comprising:

a set of Nc hybrid, multiport power dividers, each having an equal number of input ports and output ports, said number of input ports or output ports being a power of two, a power of three, or a product of a power of two and a power of three, the number of said output ports being Na, which number is equal to or greater than Ne, each of said feed elements of the antenna being excitable by one of said output ports so that for each beam provided by the antenna, each divider feeds one of the feed elements contributing to the respective beam, and each of said power dividers including an orthogonal and unitary distribution matrix;

a set of Na amplifier modules, each input port of said power dividers being connected to one of said modules, each said module comprising at least one of a transmission power amplifier and a low-noise reception amplifier, all of said amplifiers essentially operating at the same optimum nominal signal level responsive to changes in the relative loading of the beams; and a beam forming network having Nb input ports and Na output ports, each input port of said network being connected to each output port of said network by means providing appropriate insertion phase shifts for each beam, each of said Na output ports being connected to one of said Na amplifier modules connected between said dividers and said beam forming network.

2. The multibeam antenna feed device according to claim 1 wherein the antenna provides at least one beam having shape and sidelobe properties, wherein said matrices forming said dividers comprise order matrices, and wherein at least some of said matrices are of a different order than others of said matrices, the orders of said matrices being selected such that desired shape and sidelobe properties are provided to the beam.

3. The multibeam antenna feed device according to claim 1 wherein the antenna provides at least one beam having shape and sidelobe properties, and wherein a plurality of feed elements forming a subgroup generating a beam are connected to the same power divider, the excitation of said feed elements so connected being weighted by said feed device such that desired shape and sidelobe properties are provided to the beam.

4. Multibeam antenna feed device according to claim 1, wherein the matrix power dividers include generalized couplers made from 3 dB hybrid couplers.

5. The multibeam antenna feed device according to claim 4 wherein the antenna provides at least one beam having shape properties, wherein said power dividers include matrices formed to provide operational characteristics exhibited by a Butler matrix, wherein said hybrid couplers are interconnected, and wherein said power dividers include fixed phase-shifters selectively placed between some of said hybrid couplers, thereby adapting such a divider to provide desired shape properties to the beam.

6. The multibeam antenna feed device according to claim 1 wherein the antenna provides at least one beam having at least one of controllable shape, pattern, sidelobe and orientation properties, and wherein means providing insertion phase shifts in said beam forming network includes variable phase-shifters placed, for each beam having controllable properties, between the corresponding input and outputs of said beam forming network, for controlling at least one of shape, pattern, sidelobe, and orientation properties of the respective beam.

7. Multibeam antenna feed device according to claim 1, wherein the phase-shifters are analog or digital phase-shifters.

8. Multibeam antenna feed device according to claim 1, wherein the beam forming network is a digital network.

9. Multibeam antenna feed device according to claim 1, wherein the beam forming network is an optical beam forming network.

10. The multibeam antenna feed device according to claim 1, wherein the antenna provides beams having a given frequency, and wherein the beam forming network operates at an intermediate frequency with respect to the beam frequency and wherein said feed device includes frequency conversion means connected to the inputs of said amplifier modules.

11. The multibeam antenna feed device according to claim 1 further including as elements thereof said focusing means and feed elements, and wherein said focusing means comprises one of a reflector or lens means.

12. The multibeam antenna feed device according to claim 11 wherein said focusing means comprises a shaped reflector.

13. The multibeam antenna feed device according to claim 11 wherein said focusing means comprises an over-dimensioned reflector.

14. The multibeam antenna feed device according to claim 11 wherein said focusing means comprises one of a multireflector or a multilens system, or a combination of lenses and reflectors.

15. The multibeam antenna feed device according to claim 11 wherein said feed elements are positioned with respect to said focusing means at a location which is optimized with respect to the focal point of said focusing means.

16. The multibeam antenna feed device according to claim 11 wherein said feed elements are displaceably positioned with respect to the focal point of said focusing means.

17. The multibeam antenna feed device according to claim 1 wherein said dividers are connectable to the feed elements by lines, the lengths of which are selected to optimize the excitation of the feed elements.

18. The multibeam antenna feed device according to claim 17 wherein the lengths of said lines are selected to optimize the excitation of the feed elements under conditions in which all of said feed elements are excited.

* * * * *